United States Patent
Kaufman et al.

(10) Patent No.: US 7,467,180 B2
(45) Date of Patent: Dec. 16, 2008

(54) AUTOMATICALLY SEGMENTING AND POPULATING A DISTRIBUTED COMPUTING PROBLEM

(75) Inventors: James H. Kaufman, San Jose, CA (US); Tobin Jon Lehman, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 1422 days.

(21) Appl. No.: 10/448,949

(22) Filed: May 29, 2003

(65) Prior Publication Data

US 2005/0015571 A1 Jan. 20, 2005

(51) Int. Cl.
*G06F 15/16* (2006.01)
(52) U.S. Cl. .................................... 709/201
(58) Field of Classification Search ................ 709/201, 709/226, 248; 718/100, 102, 106
See application file for complete search history.

(56) References Cited

U.S. PATENT DOCUMENTS

| | | | | |
|---|---|---|---|---|
| 5,031,089 A | 7/1991 | Liu et al. | ..................... | 364/200 |
| 5,442,569 A | 8/1995 | Osano | ..................... | 364/578 |
| 5,630,129 A | 5/1997 | Wheat | ..................... | 395/675 |
| 5,938,722 A | 8/1999 | Johnson | ..................... | 709/105 |
| 6,008,848 A | 12/1999 | Tiwari et al. | ................ | 348/409 |
| 6,009,455 A * | 12/1999 | Doyle | ..................... | 709/201 |
| 6,049,819 A | 4/2000 | Buckle et al. | ................ | 709/202 |
| 6,058,266 A | 5/2000 | Megiddo et al. | ............. | 395/709 |
| 6,088,727 A | 7/2000 | Hosokawa et al. | .......... | 709/223 |
| 6,101,538 A | 8/2000 | Brown | ..................... | 709/223 |
| 6,141,699 A | 10/2000 | Luzzi et al. | ................ | 709/331 |
| 6,308,208 B1 | 10/2001 | Jung et al. | ................ | 709/224 |
| 6,345,287 B1 | 2/2002 | Fong et al. | ................ | 709/102 |
| 6,370,560 B1 | 4/2002 | Robertazzi et al. | .......... | 709/105 |
| 6,418,462 B1 | 7/2002 | Xu | ............................. | 709/201 |
| 7,124,071 B2 * | 10/2006 | Rich et al. | ................ | 703/16 |
| 7,159,217 B2 * | 1/2007 | Pulsipher et al. | ............ | 718/100 |
| 2002/0065870 A1 * | 5/2002 | Baehr-Jones et al. | ....... | 709/201 |

(Continued)

OTHER PUBLICATIONS

Saniya Ben Hassen et al., "A Task-and Data-Parallel Programming Language Based on Shared Objects," ACM Transactions on Programming Languages and Systems, vol. 20, No. 6, Nov. 1998, pp. 1131-1170.

(Continued)

*Primary Examiner*—William C. Vaughn, Jr.
*Assistant Examiner*—Yemane Mesfin
(74) *Attorney, Agent, or Firm*—Cantor Colburn LLP; Leonard T. Guzman

(57) ABSTRACT

A method is described for automatically segmenting and populating a distributed problem, including determining a bounding space that is at least equal in size to a problem space volume, partitioning the bounding space into a plurality of sub-spaces capable of holding collections of original problem cells, mapping the distributed problem into the partitioned bounding space to populate the sub-spaces with data from the problem, and determining boundaries between the sub-spaces. The method further includes determining coupling interdependencies between sub-spaces, determining complexities associated with boundaries, calculating densities of the data from the problem, and if the densities of two or more contiguous collections fall below a lower level threshold, dynamically joining the two or more contiguous collections, if a particular collection density exceeds an upper threshold, dynamically subdividing the particular collection into a finer granularity, and processing the problem based on the boundaries, the coupling interdependencies, the complexities, and the densities.

1 Claim, 17 Drawing Sheets

U.S. PATENT DOCUMENTS

2004/0210627 A1* 10/2004 Kroening .................... 709/201

OTHER PUBLICATIONS

Kwan-Liu Ma et al., "A Scalable Parallel Cell-Projection Volume Rendering Algorithm for Three-Dimensional Unstructured Data", IEEE 1997.

Chen-Chen Feng et al., "A Parallel Hierarchical Radiosity Algorithm for Complex Scenes," Proceedings IEEE Symposium on Parallel Rendering (PRS) '97, IEEE Computer Society Technical Committee on Computer Graphics in cooperation with ACM SIGGRAPH.

Chiang Lee et al., "A Self-Adjusting Data Distribution Mechanism for Multidimensional Load Balancing in Multiprocessor-Based Database Systems," Information Systems vol. 19, No. 7, pp. 549-567, 1994.

Ed Andert, "A Simulation of Dynamic Task Allocation in a Distributed Computer System," Proceedings of the 1987 Winter Simulation Conference, 1987.

"A Data Modeling Technique Used to Model Data Used in Task Analysis," Research Disclosure—Mar. 1998/297.

"User Interface for a Parallel File System," IBM Technical Disclosure Bulletin, vol. 37, No. 11, Nov. 1994.

J. Kaufman et al., "The Almaden SmartGrid project Autonomous optimization of distributed computing on the Grid," IEEE TFCC Newsletter, vol. 4, No. 2, Mar. 2003.

* cited by examiner

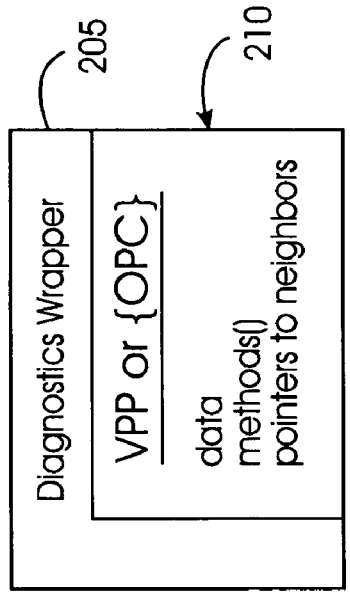
FIG. 2
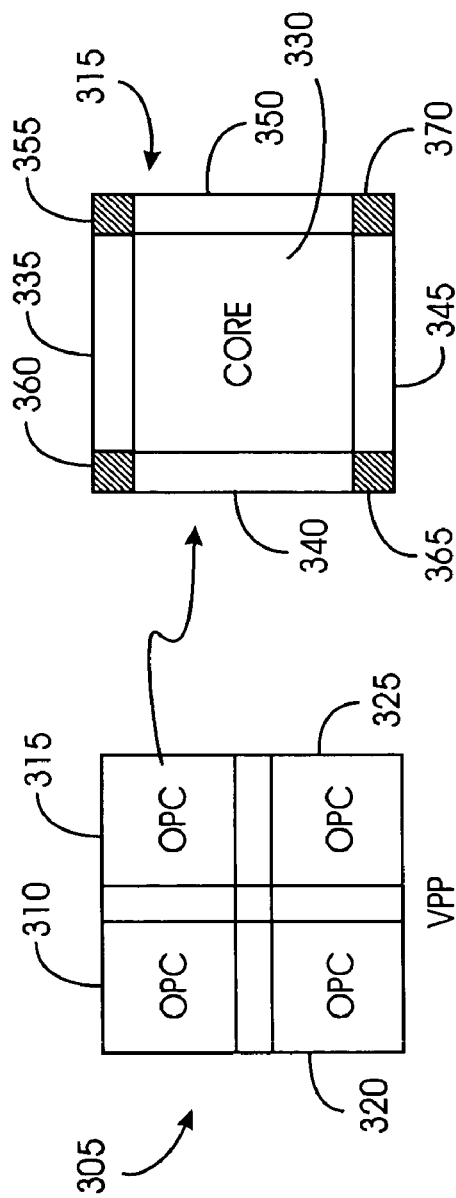
FIG. 3B
FIG. 3A

OBJECT (PROBLEM COLLECTION)

GET THE EXTENT OF THE VPPS

INITIALIZE OPCS

AUTOMATICALLY SEGMENTING AND POPULATING A DISTRIBUTED COMPUTING PROBLEM

CROSS-REFERENCE TO RELATED APPLICATION

The present application is related to co-pending U.S. application, titled "System And Method For Balancing A Computing Load Among Computing Resources In A Distributed Computing Problem," filed on even date herewith by the same inventors as the present application, which is assigned to the same assignee, and which is incorporated herein by reference.

FIELD OF THE INVENTION

The present invention generally relates to a system for performing distributed parallel computing tasks. More specifically, this invention relates to a method wherein connected problems can be automatically partitioned, populated and deployed in a distributed system, and then automatically repartitioned to balance the computing load.

BACKGROUND OF THE INVENTION

The area of computational science is growing, as more scientists are finding more problems (and larger problems) that require computational resources exceeding the capacity of a single machine. The next logical step in developing computational capability for handling these large problems is to distribute these problems over multiple machines loosely connected in a "grid".

The rapid emergence of grid computing and the promise of grid utilities may enable scientific simulation on a size and time scale heretofore unimaginable. The computing resources of grids may have their greatest impact in the fields of life sciences and science medicine. Understanding the interaction of medicines with living systems from a molecular scale to the scale of organs and systems of organs would benefit greatly from harnessing the power of computing grids. High performance grid solutions in the life sciences may someday enable personalized medicine and personalized genomics.

The idea of a computing grid was first suggested almost 40 years ago, when MIT's Fernando Corbato and other designers of the Multics operating system envisioned a computer facility operating "like a power company or water company". Reference is made to V. A. Vyssotsky, F. J. Corbató, R. M. Graham, in Fall Joint Computer Conference, AFIPS Conf. Proc. 27, 203 (1965), available at http://www.multicians.org/fjcc3.html.

In the 1960's, the primitive network infrastructure, early non-portable programming languages, and incompatible component interfaces made it difficult to build a multi-computer system of any significant size or power. Since then, advances in each of these areas (and more) have contributed to the current environment that is conducive to creating large grid computing systems out of distributed heterogeneous parts.

As the ability to process large problems grows, the appetite for large computation seems to grow faster. Whereas, just 10 years ago, scientists were content to compute the structure of a single small molecule, today they want to solve the protein-folding problem and to calculate the structures of complex assemblies of macromolecules. As grid computing moves from the purely scientific arena to become an integral part of the practice of medicine and the design of drugs, the complexity and volume of problems for the grid may grow.

Previous efforts in grid computing have addressed the issues involved with spreading a problem over a large number of computers, load sharing, and the use of idle cycles to employ more partially available computers. Each computer used to process the distributed problem within the grid is a compute agent. Independently parallel computing (IPC) processes the same data, the same code, and the same application, all in parallel. The same code is solved many times. The larger problem is broken into pieces, sent to many computers for processing, then returned to the client. IPC requires computers that are homogeneous, having the same operating system, and that have resources to process their piece of the problem to completion. When the computing problem is broken into equal loads and distributed for processing among this homogenous group of computers, the processing of the computing problem becomes exclusive for these computers; they become dedicated to the processing of that problem until processing is complete.

Systems such as the PointCast Client and SETI@Home use the screen saver process to perform useful work through IPC. SETI@Home created one of the first large-scale distributed computations by distributing small amounts of work (searching for extra-terrestrial intelligence from radio telescope data) to a large number of clients (almost 3 million) over the Internet. The SETI@Home system, for example, sends a self-contained computation to each compute node (in a user base of almost 3 million computers) that then returns the results back to a centralized site.

Another system, Condor, was one of the first systems to use idle workstations on a local area network. Condor performs an initial load check to make sure that the jobs it is distributing all go to compute nodes that can handle them, then dispatches problems to idle computers that have advertised that they can execute jobs.

A more recent system, the Globus package, helps grid programmers by offering middleware for distributed metacomputing. Globus provides a mechanism for communication, data exchange and job submission, all using a single sign-on. It also provides a mechanism for resource discovery (a concept similar to LDAP or UDDI Web Services discovery). It does not deal with non-compute resources, replicas, local user management, backend system management or compute agent management.

Similar to IPC, connected parallel computing also applies to applications and problems that are too large to fit on one computer. However, the problem addressed by these applications can't be broken into many identical pieces for processing. Rather, the problem requires dividing the application and the data into small pieces that are dissimilar. Once these dissimilar pieces are distributed to computers for processing, these pieces need to communicate with one another based on the manner in which the application or problem was divided.

There have already been many surveys of computing grid systems and computing grid problems but there is still at least one large class of complex scientific problems that have not yet been fully addressed. Reference is made to Mark Baker, Rajkumar Buyya and Domenico Laforenza, "The Grid: A Survey on Global Efforts in Grid Computing," Paul Shread, "Even Small Companies Can Benefit From Grid Computing," and Grid Survey, The foregoing systems and problems fall in the category of cellular automata or finite element models (FEM). There is currently very little work in creating a general parallel infrastructure for FEM or cellular automata problems using multiple general-purpose computers. The finite element method is the formulation of a global model to simulate static or dynamic response to applied forces. Cellular automata provide a framework for a large class of discrete models with homogeneous interactions. Cellular automata are basically a subset of the FEM family. Cellular automata are finite by definition, but they also have additional qualities that allow them to be exploited differently than the more general FEMs.

One approach to solving cellular automata and FEM problems has been to use large single address space machines that can be composed of one or more tightly-coupled computers that use hardware assist to create a single large address space. Another approach has been to use multiple homogeneous computers that use message passing. Both of these solutions require a large number of expensive dedicated machines. For certain organizations with very important problems and a significant budget, the large dedicated machine cluster is an excellent solution. However, there is a growing segment of the scientific community that needs access to a large compute facility but doesn't have the budget to afford the large dedicated computer complex.

Cellular automata and FEM are both best addressed by the connected parallel computing approach. FEM divides the problem space into elements. Each element has both data and code. However, the solution to the problem of one element depends not only on the data local to that one element but also to other elements to which that one element is connected. For example, the study of stress on a bone depends not just on the elements receiving the stress. The stress is propagated throughout the bone through the connections between elements. A FEM study of stress and response on a bone divides the bone into finite elements. Each element might have data such as elasticity and codes.

As medical and biological data goes digital and data volumes increase exponentially, large-scale simulation may become critical both to advancing scientific understanding and for the design of new system level treatments. Fortunately, many of the computational techniques required to attempt such system level studies are already under development. Furthermore, these problems are naturally adaptable to parallel processing (parallelizable). All known life is cellular. Every living cell contains all of the instructions for its replication and operation. All of the functions of a multicellular organism are performed by transporting molecular messages, establishing concentration gradients across membranes, and by local physical (e.g., protein folding) and chemical (e.g., metabolic) reactions. In principle, at the algorithmic level there are no new breakthroughs required to solve problems as complex as understanding the chemistry of life. However, all of these future applications require massive resources on the scale of a computing grid.

Unlike parallel applications that are easily distributed on a network, large-scale models of living cellular systems require ongoing communication between the computers participating in the computation. Even within a cell, membranes encapsulate function providing essential special gradients. They also, in some sense, encapsulate complexity. For example, one can imagine a model of a living cell containing an object called a "mitochondria". The model of the mitochondria might be a spatial model that accurately solves the chemistry of energy generation within the cell at a molecular level, or the mitochondria might represent a functional object that, given appropriate inputs, produces adenosine triphosphate (ATP) based on a mathematical algorithm. In either case, the cell may be described by objects, each of which provides defined function at some time scale, at a point in space, in response to various input signatures.

Models of living systems can be solved numerically by partitioning space into "small" regions or finite elements, where "small" is defined by the smallest natural scale in a problem. However, in practice the overall scale of a problem to be studied along with the available compute resource may limit the resolution of the calculation. Problem scale and available resources thus impose a lower bound on the finite element size. For large problems, collections of finite elements should be processed on different computers.

A very simple example can be used to understand the complexity introduced by requiring communication between adjacent cells in any FEM class problem. One such example is a "Game of Life" based on a modified Eden Model for bacterial growth. Reference is made to Murray Eden and Philippe Thevenaz, "The Eden Model History of a Stochastic Growth Model," available at http://bigwww.epfl.ch/publications/eden9701.html; M. Eden, Proceedings of the Fourth Berkeley Symposium on Mathematics, Statistics, and Probability, edited by J. Neumann (University of California, Berkeley, 1961), Vol. 4, p. 233. In this example, three model "bacteria" (A, B, C) are growing in a two dimensional space (e.g., the surface of a Petri dish). Using Cartesian coordinates, the smallest "elements" or "cells" in this space are squares with sides of unit length. Objects are used to represent the data contained in any cell, in this case the bacteria that may be present. Each cell also contains the methods or rules that describe local rules comprising how the bacteria interact with one another, and propagation methods that describe how they spread or reproduce. In this example, the interaction method causes bacteria A to eat bacteria B, bacteria B to eat bacteria C, and bacteria C to eat bacteria A. Reproduction or propagation to adjacent sites or cells requires that each cell also store pointers to neighboring cells. These pointers define a graph and together with the propagation method add the communication requirement to the problem. In the example, the propagate method causes, at every iteration, an entity at site (i,j) to spread to it's nearest neighbors at sites (i+1,j),(i−1,j),(i,j+1),(i,j−1) each with probability 0.5 (the classic Eden model for bacterial growth).

In this hypothetical example, the problem being studied is so large it cannot be solved on a single computer. Conceptually, it is simple to divide space (the Cartesian region) into partitions or collections of original problem cells (OPCs). Since each cell contains all the data, methods, and pointers to interacting neighbors that it needs to perform the onsite calculation, the problem is highly parallelizable. If a neighbor OPC is located on the same compute node, it is a "local neighbor". If an OPC is located on a different compute node, it is a "remote neighbor". If a problem is made up of OPCs with no neighbors at all, it is called "embarrassingly parallel" in the sense that no communication is needed to iterate the problem. If each of the four problem partitions for this example are dispatched to four different machines, then the cells in the outer shell have one or more nearest neighbors that are located on a remote machine. The problem, as defined, requires that every machine exchange data with machines handling adjacent regions of space at every cycle. They need not exchange all data, only the outer shell or interfacial cells. If the dimensionality of space is d, the data exchanged has dimensionality (d−1) provided the interfaces between partitions are kept "smooth".

The grid infrastructure required to solve this class of problem should provide for efficient communication between neighboring problem pieces. Since the state of one part of the overall problem depends (transitively) on all adjacent parts, it is necessary to keep the parts relatively synchronized. If the compute agent responsible for one part of the problem were to fall behind, then the other compute agents could proceed no faster than the slowest one. The existing grid systems using currently available technology do not provide for inter-communicating problem pieces or manage the load of individual nodes to balance the progress of all the compute agents.

There exist a plethora of commercial tools to facilitate finite element analysis studies on a single workstation comprising products by algor, altair, ansys, comsol, cosmos/m, EDS, and others. Reference is made to Commercial FEM products, When the problem to be solved is very large and the solution to the problem is economically important, dedicated parallel machines are employed. There is no shortage of complex problems requiring parallel computation to solve. The primary cost factor limiting the application of these techniques is the availability of parallel machines and storage.

Cellular problems are ubiquitous in nature comprising the life sciences, physics, and chemistry. They describe anything involving cellular interaction (e.g., all of life) or anything involving flow (air, fluids, money, finance, system biology, drug interactions, circuit design, weather forecasting, population study, spread of disease in populations, cellular automata, crash testing, etc.). To better exploit the power of the grid, one should go beyond solving the most massively parallel (e.g., SETI@Home) class of problems and develop techniques to efficiently manage problems requiring frequent communication between adjacent problem partitions.

The promise of grid computing in general is that a method may be found to employ idle computers around the world to work on all sorts of problems, ranging from scientific problems to business problems to just plain interesting problems, like the search for extra terrestrial life. However, the state of "grid computing" today is a set of utilities and tools that exist to help one build a grid system. There are very few general-purpose complete grid systems, and there are no grid systems that are tailored to the general-purpose management of FEM problems where those problems can be dynamically managed to squeeze the most out of the computer resources.

In addition, once a problem has been created, with the mesh defined, the owner wishing to parallelize a problem usually has to define the pieces of the problem that may be sent to the various compute agents that may (collectively) solve the problem. The initial partitioning of a distributed computing task can be critical, and is often a source of tedium for the user. Thus, given a problem such as analyzing a bone (a femur), the user would be responsible for taking the bone and creating the various collections that would delineate the sub-problem regions for the compute agents that may then solve the problem. This process is tedious and time consuming.

Once a problem is distributed on a grid, balancing the progress of the problem among all its pieces becomes an issue. Given any problem that requires communication between compute nodes to proceed (any interconnected parallel problem), a single slow compute agent can slow down an entire computation. Similarly, a failed node can halt the computation altogether. On a grid, recovery from a failed node presents the same problem as recovery from a node that has become so busy that it is no longer useful. A slightly slower compute agent might be assigned a smaller or "easier" piece to solve. A failed or heavily loaded machine should be replaced. Current grid technology does not provide for such needed load balancing.

Current grid technology resizes problem pieces (referred to as Variable Problem Partitions or VPPs) by moving individual elements (referred to as OPCs) from one VPP to another. This technique is inherently inefficient, as it changes the design of the problem, it causes a recalculation of the problem edges and it can cause a significant increase in communication costs if the problem piece edges "roughen".

Grid computing is still in its infancy. There are numerous tools available for building various types of grid applications, but as yet, no one size fits all. Although problems solved by grid computing are often very sophisticated, the problem management software today is still quite primitive. Existing grid software manages the movement of problem pieces from machine to machine (or server to machine). However, it does not provide for sophisticated management of the problem pieces, does not account for correlations between problem pieces, does not provide a representation of problem piece requirements, and does not adapt the problem itself to dynamic changes in available computing resources.

A system is needed that uses a simple interface and allows domain experts to use the grid to tackle many of the most challenging and interesting scientific and engineering questions. This system should be able to efficiently partition FEM problems across a large collection of computer resources and manage communication between nodes. This system should also be able to dynamically optimize the complexity of problem pieces to match the changing landscape of compute node capabilities on the grid. Furthermore, this system should be able to partition a spatial problem into any regular or describable irregular configuration. The need for such a system has heretofore remained unsatisfied.

SUMMARY OF THE INVENTION

The present disclosure satisfies this need (collectively referred to herein as "the system" or "the present system") by presenting a method for automatically segmenting a connected problem (or model) into fixed sized collections of original program cells (OPCs) based on the complexity of the task (also referred to herein as problem) specified and the combination of computing agents of various caliber available for the overall job. OPCs are held in fixed-size sets called OPC collections. Multiple OPC collections are held in one "Variable Problem Partition" (or VPP), which is the amount of the problem that is delivered to one compute agent to be solved.

In the case of a connected problem (disconnected or "independently parallel" problems don't have communication), the OPCs that are on the edge of a collection can communicate with OPCs on the edges of neighboring collections, and are indexed separately from OPCs that are within the 'core' or inner non-edge portion of a collection. Consequently, core OPCs can iterate (i.e., compute the next value of their problem state) independently of any communication occurring between collections and groups of collections that are variable problem partitions (VPPs). All the OPCs on an edge have common dependencies on remote information (i.e., their neighbors are all on the same edge of a neighboring collection). This makes it easy to determine which collection a particular cell belongs to, and it's easy to detect the boundaries between the different collections. VPPs are then assigned to various computing agents for execution. This "problem-building" or compiling step filters a potentially huge number of program cells into manageable groups of collections (task portions), and such filtration data can be saved for use by any type of distributed computing system.

The present system defines a generalized spatial filter that can partition a spatial problem into any regular or describable irregular configuration. Thus, the user does not need to perform any manual steps to segment the problem; she just chooses the segmenting scheme (matrix, cube, honeycomb, etc.) and submits the problem. The present system allows the userto simply specify the overall geometry of the problem and compute the meshing. The present system uses this spatial collection filter to segment the problem space into fixed size volumes (or areas, or whatever unit is appropriate for the dimension being used) as needed. To accomplish this, the filter might do more than simply partition the problem space, it might also predefine the relationships between regions. The present system allows this automatic discovery of relationships between problem pieces.

The present system effectively manages a complex distributed computation on a heterogeneous grid. Philosophically, the present system makes the assumption that full administrative control is not maintained over the available compute nodes. These nodes may be subject to unknowable and unpredictable loads. Since a single slow compute agent may slow down the entire computation, autonomic load balancing is critical to distributed computation in such and environment. On the grid, recovery from a failed node is equivalent to recovery from a node that has become so busy it is no longer useful. A slightly slower compute agent might be given a smaller or "easier" piece to solve, a failed of heavily loaded machine should simply be replaced. The present system is designed to deal with both situations, load balancing the distributed computation to maximize computational resources and efficiency.

The present system computes the bounding space around the problem, and then segments the problem space into fixed size collections, where the number of collections is based on the measurements of the problem. As an example, suppose there was a problem that required 100 average computers to solve it. The system might pick the number of OPC collections to be between 400 and 1600. The actual number is determined by balancing the cost of the internal structure (more boundaries, more work) with the flexibility for repartitioning (fewer, larger chunks limits flexibility). These boundaries form a virtual spatial collection filter. As the present system passes though the problem and looks at each OPC, the present system can see from the filter to which collection the OPC belongs. Furthermore, the present system can automatically detect the boundaries of the OPC collections.

The present system takes a large inter-connected problem, automatically partitions it and deploys it to machines on the Internet according to existing compute resource, domain authorization rules, problem resource requirements and current user budget. Once the problem is deployed across a potentially large number of computers, the present system manages the distributed computation, changing computers, problem piece allocation and problem piece sizes as appropriate to maintain the best possible performance of the system.

The present system uses a distributed communications infrastructure that is both scalable and flexible. The communication component comprises several different pluggable communications mechanisms so that different types of data transports can be used, depending on what sort of communication infrastructure is available The main administrative component is the master coordinator. The master coordinator directs the loading of problems, the creation of new problems, and the launching of problems. The master console is the user's window to the distributed system. From the master console, the user can both monitor user-level values/events and system-level values/events. Furthermore, the user can make changes in the running system that result in either system-level or user-level alerts which propagate to the compute agents that are running the distributed parallel problem code. A tailored cost-based rule engine determines the best system configuration, based on a large set of system parameters and rules. The rules have been established by extensive system testing/monitoring.

The smallest piece into which the problem can be broken using FEM or cellular automata is the original problem cell (OPC). The problem-specific code for the problem represents the internal state of an OPC; the specifications of the OPC depend on the resolution or granularity required by the result. The OPC defines the problem or application; it can also be viewed as a graph where the nodes of the graph contain data, codes (the application to be run), and pointers to other nodes or OPCs. An OPC has neighbors; these neighbors are typically needed to compute the next state of an OPC. Each OPC also maintains a set of neighbor vectors (though the present system hides the fact that some of these may be remote neighbors). However, there are typically so many of these OPCs that they won't fit on one computer. Consequently, The OPCs are first grouped into "OPC Collections", then those collections are grouped into Variable Problem Partitions (VPPs), which are then processed on multiple computers.

Variable Problem Partitions (usually comprising multiple OPC Collections), are variable because the number of OPCs varies depending on the compute capacity of the compute agent. Each VPP represents the amount of the problem that is given to a compute agent. The total set of VPPs makes up the complete parallel problem. A VPP is self-contained except for the OPCs on its edge. A compute agent can compute the state of all its OPCs (the internal OPCs), but it might communicate those OPCs on the edges to the compute agents holding the neighboring VPPs.

Unlike currently available methods for grid computing, the present system provides dynamic load balancing which dynamically resizes the partitions based on the capability of the available resources, i.e., the capability of individual computers available for processing. In a grid, machines are different and loads are unpredictable; the present system adapts the problem to the capability of the network.

In one embodiment, the method of the present invention calculates the densities of the various OPCs. If a particular collection density exceeds an upper threshold, the method dynamically subdivides that particular collection into a finer granularity. Further, if the densities of two or more contiguous collections fall below a lower threshold, then the method dynamically joins these contiguous collections, provided the density of the joined OPCs is less than the upper threshold.

Having supplied the OPC class data, a user configures the system as appropriate to the specific problem, then writes the problem builder code to set up the geometry (meshing) of the problem. Once the problem is completely defined, the user signals the master coordinator to advertise the problem via a directory service (e.g., LDAP, UDDI). When the master coordinator sees that an advertised problem is compatible with a set of advertised compute agents (that both advertise their availability and their performance metrics), it launches the problem across the appropriate number of compute agents. Periodically, after a predetermined number of problem iterations (compute sequences), the master coordinator assesses the progress of the problem and makes adjustments as appropriate by rearranging problem pieces, changing sizes of problem pieces, enlisting new machines, retiring old machines, etc.

In addition, the present system addresses the issue of compensation for the organizations or individuals that offer the use of their machines for computing problems. Problem owners pay for computing services (in either regular currency or some bartered arrangement); the cost of computing is figured into the employment of the compute nodes. Consequently, each problem is computed at an optimal level that comprises time, speed, compute power, and user budget. For example, if a user had an unlimited expense budget (but didn't have capital money to buy machines), then the present system would try to employ a large number of very fast machines, regardless of cost. However, if cost were a factor, then the present system would try to employ the right number of machines that gave the best tradeoff of price/performance. Furthermore, a micro-payment broker records the progress of each successful compute sequence by each compute agent (as well as checking the validity of their answers) so that the final accounting can give them credit for participating in the problem.

The present system is a distributed computing middleware designed to support parallel computation on any grid, cluster, or intranet group of computers. The present system is designed to support parallel applications requiring ongoing communication between cluster processors. Examples of these applications comprise cellular automata, finite element modes, and any application wherein computational progress depends on sharing information between nodes. The present system provides autonomic features such as automatic load balancing of a problem to dynamically match the distribution of problem piece complexity to the distribution of compute agent capability on the cluster.

The present system can be implemented in a variety of ways: as a grid service or compute utility, as a problem management system for a dedicated compute cluster, as a system to manage use of idle compute cycles on an intranet, etc.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 2 is a diagram illustrating a diagnostic wrapper on a variable partition problem used by the system of FIG. 1;

FIG. 3 is a diagram illustrating the collection of original problem cells into variable problem partitions by the system of FIG. 1;

DETAILED DESCRIPTION OF PREFERRED EMBODIMENTS

The following definitions and explanations provide background information pertaining to the technical field of the present invention, and are intended to facilitate the understanding of the present invention without limiting its scope:

Cellular Automata: Provides a framework for a large class of discrete models with homogeneous interactions. Cellular Automata are characterized by the following fundamental properties: they comprise a regular discrete lattice of cells; the evolution takes place in discrete time steps; each cell is characterized by a state taken from a finite set of states; each cell evolves according to the same rule which depends only on the state of the cell and a finite number of neighboring cells; and the neighborhood relation is local and uniform.

Compute Agent (CA): A computer node on a grid or a virtual machine running on a node, i.e., the computation resource on the grid.

Finite Element Model (FEM): The finite element method is the formulation of a global model to simulate static or dynamic response to applied forces, modeling for example energy, force, volume, etc. Finite element steps comprise setting up a global model comprised of continuous equations in terms of the world coordinates of mass points of the object; discretizing the equations using finite differences and summations (rather than derivatives and integrals); and discretizing the object into a nodal mesh. The discretized equations and nodal mesh are used to write the global equations as a stiffness matrix times a vector of nodal coordinates. The FEM can then be solved for the nodal coordinates and values between nodal coordinates can be interpolated.

Grid: A network and/or cluster of any number of connected computing machines.

Figure 1:
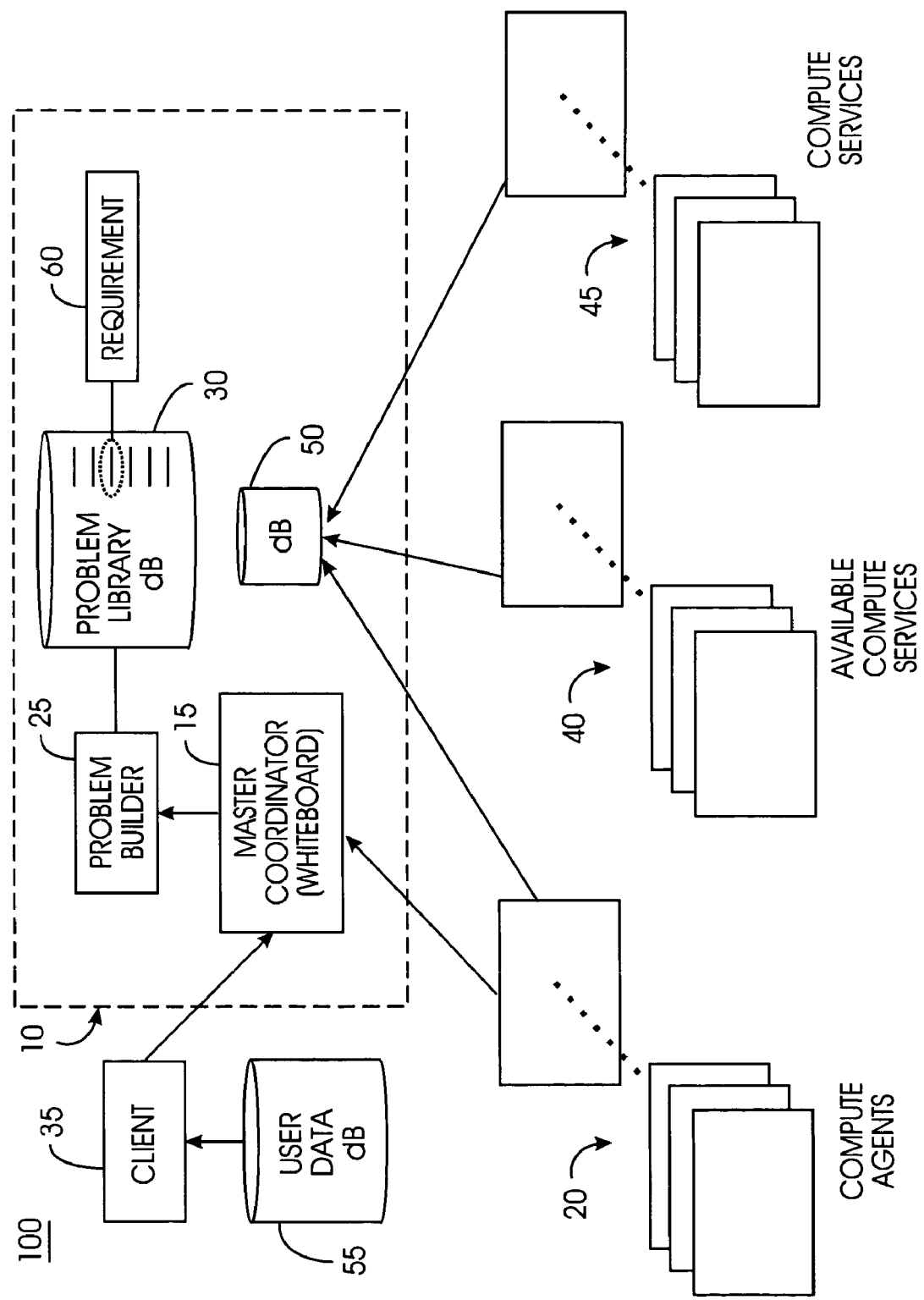
FIG. 1 is a schematic illustration of an exemplary operating environment in which a system and method for automatically segmenting and populating a distributed computing problem according to the present invention can be used.

FIG. 1 illustrates an exemplary high-level architecture of a grid computing management system 100 designed to solve interconnected problems, such as cellular automata or finite element model problems. System 100 targets the compute environment of the Internet, where the machines being used are not necessarily dedicated, nor are they necessarily in the same administrative domain. System 100 comprises a problem management system 10 that uses a standard schema for problem cell state, structure, and inter-cell interaction to assign problem pieces to computing agents based on actual resource/performance metrics. System 10 also reassigns and restructures the problem pieces to balance the computing load. System 10 comprises a software programming code or computer program product that is typically embedded within, or installed on a computer. Alternatively, system 10 can be saved on a suitable storage The main coordinator component of the system 10 is the master coordinator 15. The master coordinator 15 manages the compute agents 20 and the pieces of the problem. In addition, the master coordinator 15 is responsible for invoking a problem builder 25 (the component that creates the initial problem) and assigning the initial distribution of the problem given all of the information maintained on problems, compute agents 20 and the general computing environment.

Problem information is maintained in problem library dB 30. The master coordinator 15 also invokes the various pluggable Rule Engines that track the events of the system 10 and store the lessons learned for optimizing the problem computation. The master coordinator 15 functions as a "whiteboard", and is also referenced interchangeably herein as whiteboard 15.

The problem builder 25 is an autonomic program manager (APM) or coordinator. The problem builder 25 functions as an application coordinator. Each time a new application is launched on the grid, a new instance of problem builder 25 is launched. The problem builder 25 oversees the parallel operation of the application for as long as it "lives". The problem builder 25 accesses the white board 15 and observes the diagnostic data, the performance being achieved on the grid. The problem builder 25 can then connect a pluggable rules engine (also known as an autonomic rules engine (ARE)) and make decisions regarding the need for load balancing and how to achieve the load balancing goal.

One example of a suitable master coordinator 15 is a lightweight database system, such as Tspaces, coupled with a Tuplespace communication system, written in Java®. Tspaces, like all Tuplespace systems (i.e., Linda®, Paradise®), Javaspaces®, GigaSpaces®, IntaSpaces®, Ruple®) uses a shared white board model. The white board 15 is a distributed Linda® system that allows all clients 30 to see the same global message board, as opposed to multiple point-to-point communication. By issuing queries containing certain filters, clients 30 can see tuples posted by others. For example, a client 30 might issue a query, read "all sensor data from sensor #451" or consume "all statistics data from compute agent #42".

A cluster of compute agents 20 is assigned to a communication server that acts as a whiteboard 15. System 10 has many clusters and many whiteboards 15. Each VPP is connected to other sections of the problem. This provides mapping between the VPPs and the whiteboards 15.

Compute agents 20 are the compute nodes; they perform the actual computation. Compute agents 20 are those computing machines selected from a pool of available compute services 40, 45 to process a VPP. Compute agents 20 receive a VPP from the master coordinator 15 and process it, communicating with the compute agents 20 that hold the neighboring VPPs. The Micro-Payment Broker (MPB) tracks the compute cycles performed by each of the compute agents 20 and sends a payment into the account of the compute agent 20 account for each successful compute sequence. The MPB uses a multi-part key that comprises the original computation, the specific computation sequence, the VPP, the Compute agent 20 and a problem verification code. This multi-part key ensures that the payments are not faked or stolen. System 10 provides flexible communication, event notification, transactions, database storage, queries and access control.

A compute agent 20 runs an initial self-test to show its expected capabilities, stored on the database (dB) 50 as a self-profile. When a compute agent (CA) 20 announces its availability to participate in the grid, it looks for the self-profile stored on coordinator dB 50 or some other lookup directory for services. If the CA 20 doesn't find the self-profile, system 10 runs a series of tests and creates the self-profile, typically in the form of an XML file. The self-profile comprises CA 20 characteristics such as performance data (i.e., CPU speed and memory) and profile information (i.e., operating system and type of computing machine). The problem builder can assign some resources from compute services 40, 45 to be servers, the rest can be assigned as CAs 20.

System 10 does not depend on the self-profile of compute agent 20 capability to dynamically load balance on a grid. At every program time step, the system 10 measures important parameters critical to any application. These measurements comprise iteration time (floating point and integer math), communication time, latencies, etc. All of this data is comprised in the lightweight diagnostics wrapper 205 as shown in FIG. 2. A diagnostics wrapper 205 is associated with each VPP 210. VPP 210 may comprise only one OPC. Each CA 20 is communicating performance to system 10; system 10 uses this information to repartition the VPPs as needed to achieve optimum performance.

The performance measurements and problem piece complexity are each fed back to the master coordinator 15 after a configurable "compute sequence" time. Based on this data and pluggable rules engines, system 10 may develop and execute a (re)partition plan exchanging OpcCollections between VPPs and load balancing the problem. This is all performed in a layer below the application and the application developer need write no code to benefit from this functionality. The algorithms for managing the state of the problem elements and for interacting with neighboring pieces are all stored in abstract classes for the OPC and VPP objects.

A client 30 submits a problem to system 10, using information in user data dB 55. The problem builder 25 has in its problem library dB 30 many different problems from which the client 30 may choose. In an alternate embodiment, the client 30 may create and save their own application on the problem library dB 30. The client 30 communicates with the problem builder 25 through the whiteboard 15. The problem chosen from the problem library dB 30 has parameters that are associated with it, as shown by requirement 60. The client provides data from user dB 55 to match required parameters in requirements 60, and runs the application or problem. The problem builder 25 may automatically partition the problem into OPC collections, based on the problem complexity. Those OPC collections are grouped into variable problem partitions based on the budget of client 30 and available compute services 40, 45.

System 10 breaks up the problem into VPPs based on availability and optimization or resources (CAs 20). Initially, system 10 knows the number of available compute services 40, 45 and their capabilities from their self-profiles. In addition, system 10 knows the complexity of the problem as provided by such values as the number of OPCs, connections between the OPCs, and the size of the OPCs. Based on the complexity of the entire problem and the capabilities of available compute services 40, 45, system 10 determines the number of VPPs into which the problem may be partitioned. Each VPP comprises one or more OPCs. Initially, system 10 divides the problem for an optimum number of CAs 20. If the optimum number of CAs 20 is not available, system 10 can still predict how long it may take to solve the problem.

A simplified VPP 305 is shown in FIG. 3 (FIGS. 3A and 3B) with four representative OPC collections 310, 315, 320, 325. Each OPC collection 310, 315, 320, 325 comprises a core 330 and edge collections 335, 340, 345, 350, as shown by OPC collection 315 in FIG. 3B. The core 330 is an array of pointers to those OPCs in the collection that have no connection outside the collection. Consequently, the computation within the core 330 could be performed without waiting for communication between CAs 20. Another set of objects in OPC collection 315 are the edge collections; each OCP such as OPC 315 have eight edge collections 335, 340, 345, 350, 355, 360, 365, 370. By definition, edge collections have a common set of remote dependencies. The edge collections 335, 340, 345, 350, 355, 360, 365, 370 are grouped according to their dependencies. These OPC collections are defined before system 10 starts the run. The graph is defined in the problem builder 15. Consequently, load balancing requires minimal computations.

An initial exemplary abstract problem would be a simple 2D matrix. Suppose that, in this particular example, the FEM problem was composed of 2 million 2-dimensional elements (OPCs) using a simple square mesh. For a given complexity, the problem builder 25 might create 800 collections of 2500 OPCs each, with an average 16 collection VPP having about 40,000 OPCs. With an even distribution, 50 compute agents 20 would each get a 40,000 VPP (with the unit of change/modification being one 2500 collection). Faster networks (or shorter communications latency) might allow more compute agents 20 with smaller VPPs, while larger memories of compute agents 20 and a slower network might require fewer, larger VPPs.

Figure 4A:
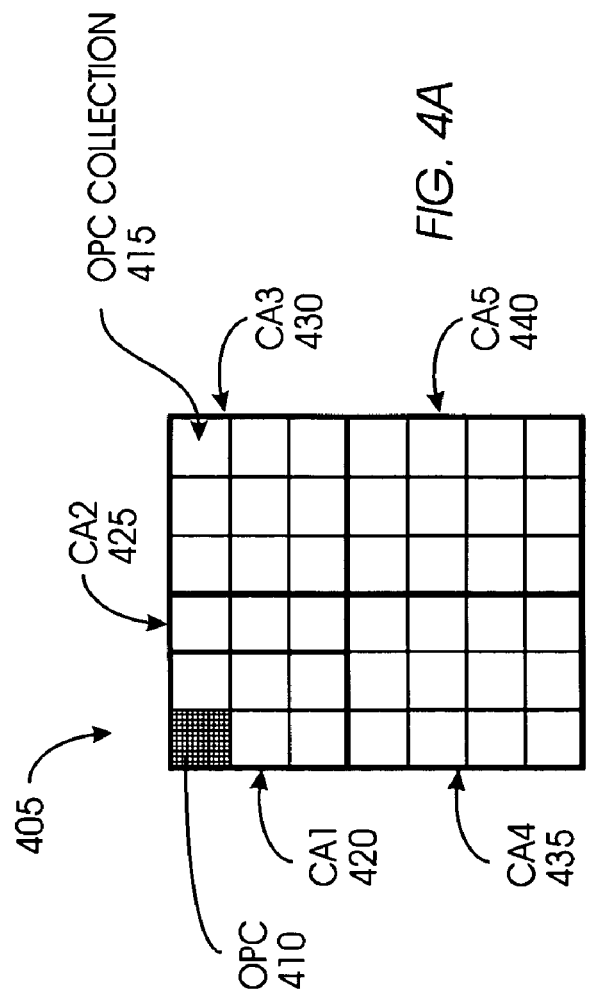
FIG. 4 is comprised of FIGS. 4A, 4B, and 4C, and represents the distribution of variable problem partitions among compute agents initially and after load balancing by the system of FIG. 1.
Figure 4B:
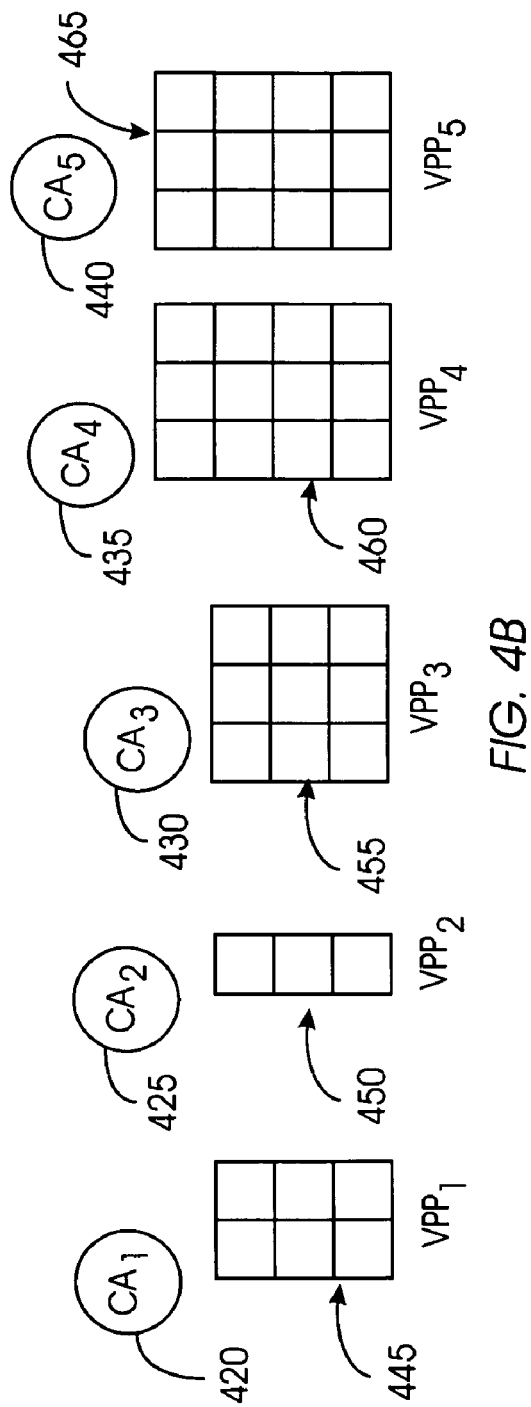
Figure 4C:
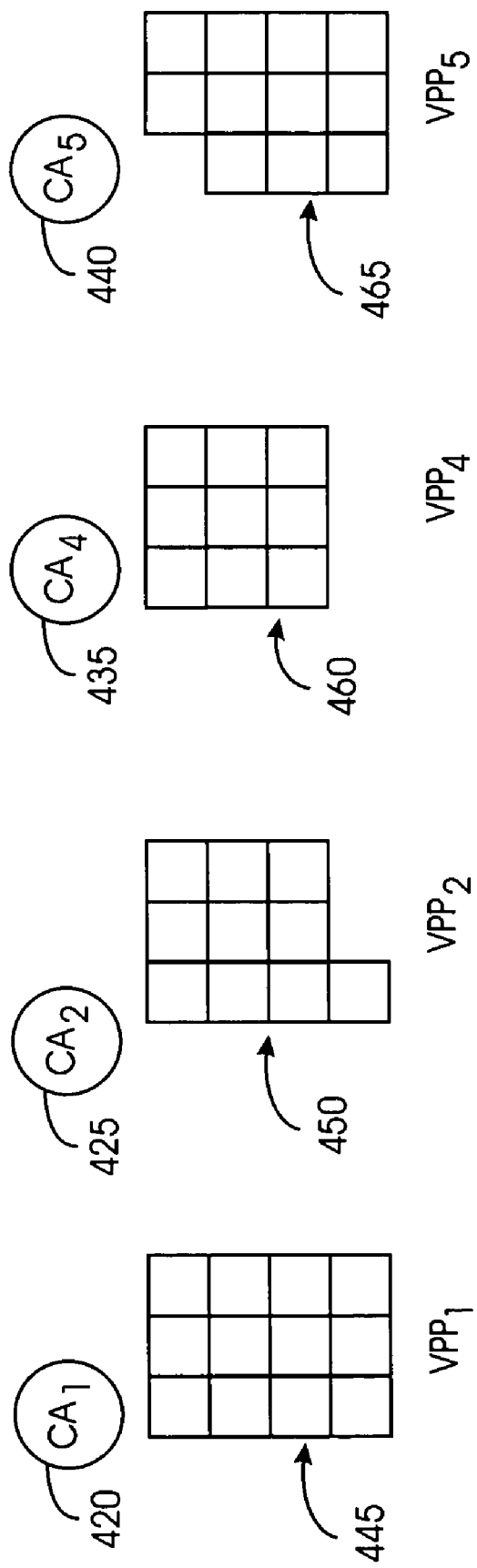

An exemplary problem 405 is shown in FIG. 4 (FIGS. 4A, 4B, 4C). The problem is initially divided into many OPCs such as OPC 410. Based on the size of the problem and available compute resources, the OPCs are assigned to OPC collections such as OPC collection 415. Each OPC collection is a fixed number of OPCs. In this simple example, problem 405 is divided into 42 OPCs. System 10 surveys the compute resources available, and chooses CA1 420, CA2 425, CA3 430, CA4 440, and CA5 445 to process problem 405. Based on the capability of each CA available at the beginning of processing, system 10 assigns a group of OPC collections to each CA; this group is the VPP. As shown in FIG. 4B, CA1 420 receives VPP1 445 with six OPC collections. CA2 425 has less processing capability available to process the problem; it receives VPP2 450 with three OPC collections. CA3 430 has more processing capability available; it receives VPP3 445 with nine OPC collections. CA4 435 and CA5 440 both have the most processing capability available. CA4 435 receives VPP4 with twelve OPC collections; CA5 440 receives CPP5 465, also with twelve OPC collections.

An important aspect of the inter-cell relationship of cellular automata computation is that the overall computation cannot progress if part of the computation is behind. Assume a different CA 20 is processing each VPP. The efficiency of a compute agent 20 depends on network bandwidth as well as processing power, memory, and perhaps storage performance. In the absence of communication, faster compute agents 20 would process VPPs at a higher frequency. However, because the VPPs (and therefore the compute agents 20) might communicate, the fastest compute agent 20 can be at most N time cycles ahead of the slowest agent, where N is the number of neighbors separating the fastest and slowest agents. Consequently, to compute the overall state of cellular automata as quickly as possible, it is necessary to keep the ratio, of VPP complexity to computing resources capability as closely matches as possible for all problem pieces.

This can be especially challenging, given that the idle compute nodes on a grid can change status frequently (from idle, to partially busy, to very busy) and can disappear altogether. A solution for keeping the system nearly balanced is to track the progress of all of the compute nodes constantly and reapportion the problem as needed. This is the essence of the autonomic feature of the system 10; constant monitoring of system measurements for all of the pieces, a mechanism to change parameters and reapportion the system, and a place to remember which situations require which changes.

Load balancing is illustrated through FIG. 4 (FIGS. 4A, 4B, 4C). Initially, $CA_1$, 420 received $VPP_1$ 445 with six OPC collections. $CA_2$ 425 received $VPP_2$ 450 with three OPC collections. $CA_3$ 430 received $VPP_3$ 445 with nine OPC collections. $CA_4$ 435 received $VPP_4$ with twelve OPC collections; $CA_5$ 440 received $CPP_5$ 465, also with twelve OPC collections. At every program time step, the system 10 measures important parameters critical to problem 405. These measurements comprise iteration time (floating point and integer math), communication time, latencies, etc. While monitoring the performance of each $CA_1$ 420, $CA_2$ 425, $CA_3$ 430, $CA_4$ 435, and $CA_5$ 440, system 10 notes that the performance of $CA_5$ 440 and $CA_4$ 435 has degraded and processing has slowed; their have fewer resources available for processing. $CA_3$ 430 has dropped offline. Meanwhile, $CA_2$ 425 and $CA_1$ 420 both have more capability available than when the problem started. Consequently, system 10 shifts OPCs from $CA_3$ 430, $CA_5$ 440, and $CA_4$ 435 to $CA_1$ 420 and $CA_2$ 425, balancing the load with compute agent 20 capability, as shown in FIG. 4C. $VPP_1$ 445 of $CA_1$ 420 now has twelve OPC collections, $VPP_2$ 450 of $CA_2$ 425 has ten OPC collections, $VPP_4$ 460 of $CA_4$ 435 has nine OPC collections, and $VPP_5$ 465 of CA5 440 has ten OPC collections. System 10 dynamically changes the sizes of the VPPs assigned to each compute agent 20 to maximize the compute resources available with respect to the budget of client 35. While this example shows system 10 redistributing OPCs among the CAs 20 already assigned the problem 405, system 10 could also have selected new CAs 20 from compute services 40, 45 and assigned VPPs to them for processing.

A client 30 supplies the code for several classes. These classes comprise an OPC class, and a class of problem builder 25. The OPC class defines the problem or problem space of the client 30. System 10 is described using Cellular Automata and Finite Element Problems as an example. In fact, the system is much more general. System 10 can manage any problem that can be expressed as a graph where the nodes of a graph contain data, methods, and pointers to neighbors. The OPCs describe the data, methods, and pointers to neighbors that constitute the problem space. An application developer may use one or more multiple OPC classes.

The Problem builder 25 defines the initial problem, populates the OPCs with data if necessary, and divides the problem into pieces. System 10 provides several implementations of an abstract ProblemBuilder class. One application generates a generic problem using rectilinear coordinates in a space of any dimensionality. The client 30 merely specifies the overall volume of space. OPCs within the space may be (optionally) initialized using a very simple VppDataInitializer class. Alternatively, system 10 provides a simple XmlProblemBuilder class and XML schema allowing a client 30 to define and initialize virtually any problem space. System parameters are set in a simple system configuration (text file) and or by command line options. A configurable problem configuration infrastructure of client 30 makes it simple for an application developer to specify and access application configuration settings in a text-based problem configuration file.

To coordinate the different components in system 10, an intelligent connection-ware component that provides flexible communication, event notification, transactions, and database storage, queries and access control is used. The central controller allows the use of a single master console to control system parameters in any component regardless of the attributes of the physical machine on which the component resides. The loosely coupled nature of the connection-ware allows new components to be added, old components to be removed or changed (even on the fly), and new relationships (between components) to be created. In addition, system 10 is not limited to a single point of control. The architecture can easily be extended to comprise a hierarchy of coordination spaces.

Distribution of the communication servers is straightforward with system 10. As discussed above, each VPP running on a compute node might "know" the address of other VPPs with which it shares information. It is straightforward, therefore, to also encode the communication pathway or address of the server to which that VPP is assigned.

Figure 5A:
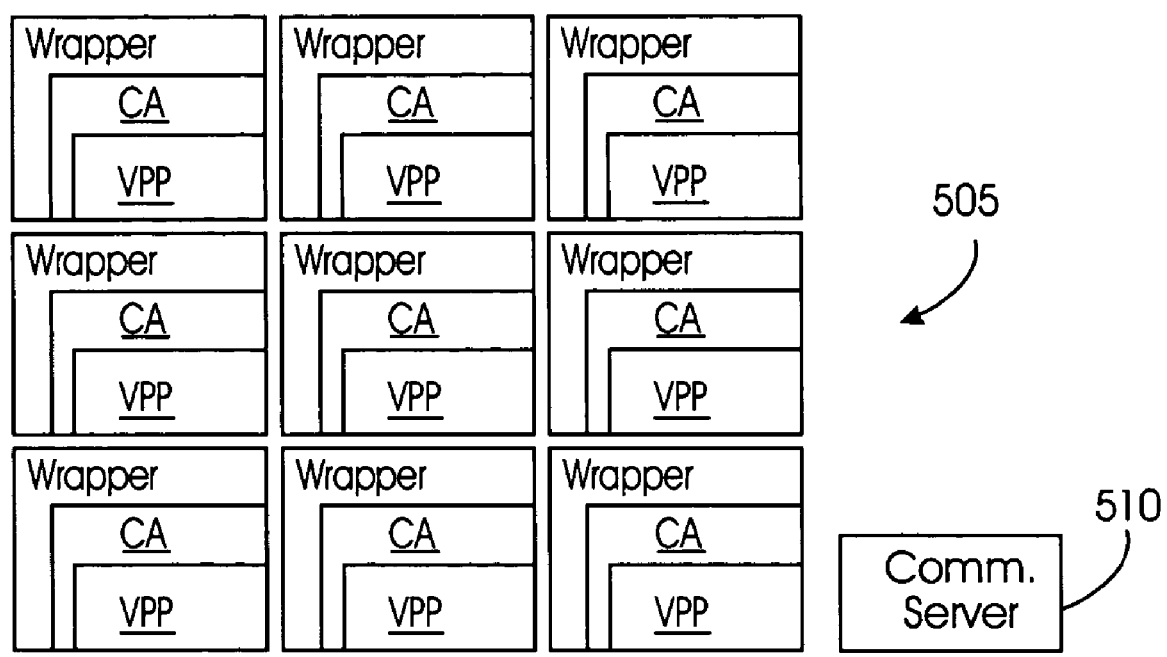
FIG. 5 is a diagram representing a typical distribution scheme of variable problem partitions among compute agents and communication servers by the system of FIG. 1.
Figure 5B:
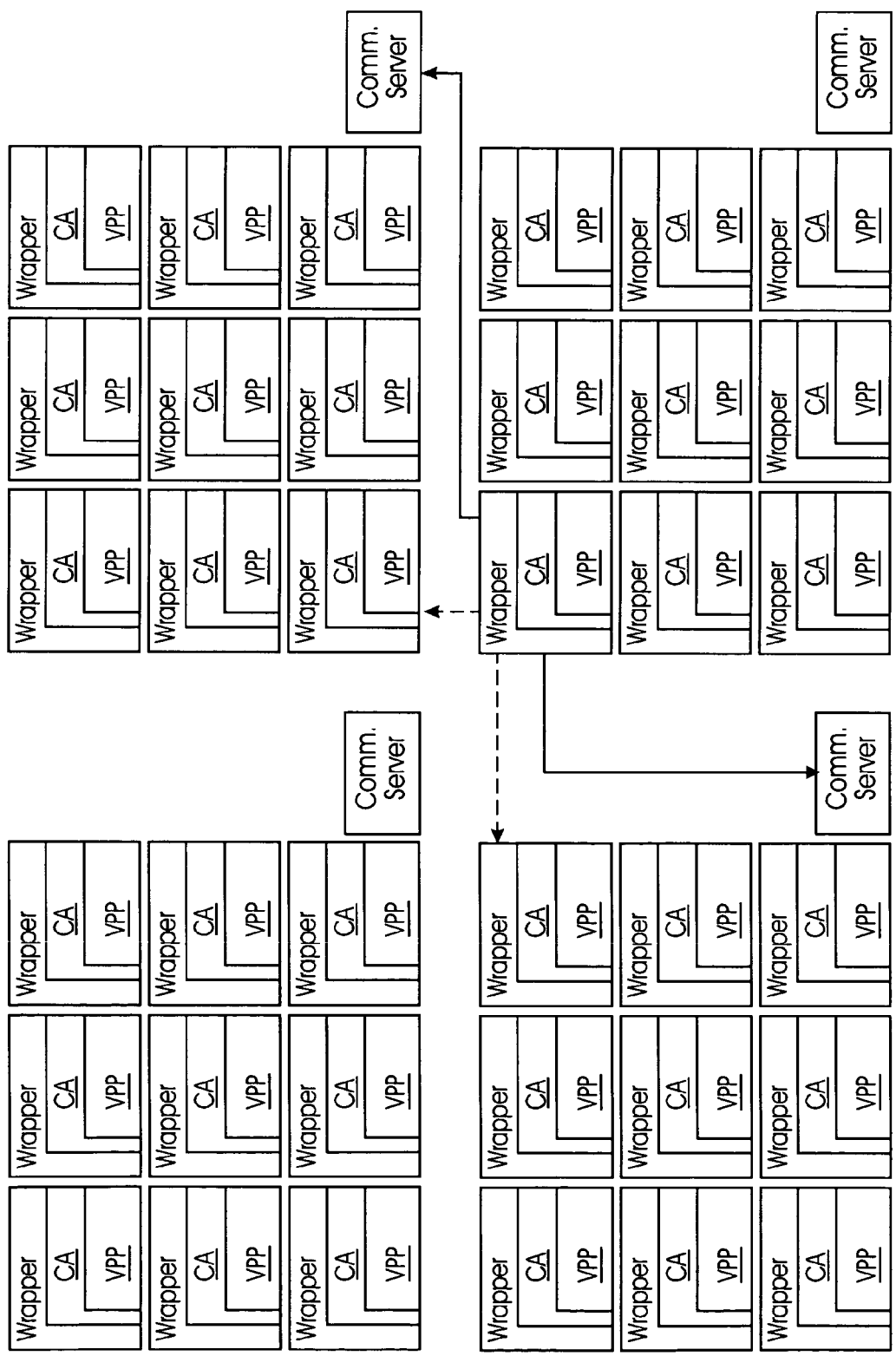

FIG. 5 (FIGS. 5A, 5B) shows a group of nine VPPs 505 that might be assigned to one communication server 510. In this example, each of the nine agents responsible for the VPPs shown exchange tuples through the same server 510. FIG. 5B shows a typical distribution scheme. Compute nodes sharing data with VPPs using other servers simply route those specific messages and requests accordingly.

The actual communication mechanism employed for a particular VPP "paring" is, in fact, "pluggable". Although the default communication mechanism is a communication server, any other communication infrastructure, such as a peer to peer system, could be used. Since the pair-wise VPP communication information contains the mechanism itself in addition to the address and other information, every VPP paring could potentially have a separate communication mechanism.

To realize the full potential of grid computing, system 10 should provide autonomic management of problem execution and automatically partition a problem at a problem building stage. This can be quite challenging for applications that require communication between the problem pieces. However, hiding the complexity of the data partitioning and data distribution steps in system 10 greatly simplifies the creation of new applications and services running on grids.

Given a collection of objects defining the initial problem state for an abstract grid application, automating the creation of an initial set of problem partitions begins with simply determining the number of pieces into which the problem may be divided. System 10 assumes that the number of resources available on the grid is large compared to the number of resources required to solve the abstract problem (as determined, for example, by the minimum memory required). Regardless of problem size, there is an optimal number of compute agents 20 that should be assigned to a given problem. If the number of compute agents 20 is too few, the problem may not fit in memory or the execution time might be unnecessarily slow. If the number of compute agents 20 is too large, then unnecessary communication cost may be incurred leading to lower performance. The optimum amount of parallelism for a given problem varies per the problem size.

The challenge is to predict the optimal resource commitment for a given problem, determined by the problem complexity (amount of computation needed per OPC and memory requirements per OPC), problem size (number of OPCs), network latency and bandwidth, CPU capacity of the compute agents 20 and disk requirements of the problem (amount of data logged or generated). For example, the following communications infrastructure can vary during the execution of a single problem: the number of available machines, the complexity of the problem, the cost of the machines, the speed of the network and the compute rating of the available computers.

Key to the system 10 data structure is the OpcCollection object, which is an array of OPCs (a collection of OPCs representing a fixed space) that also tracks all remote dependencies for the group. The OpcCollection may be thought of as a "tile" that, having been defined in the problem building stage, never changes during the execution of an application. Variable Problem Partitions are then formed by collections of OpcCollection tiles, and load balancing may later be accomplished by exchanging OpcCollections between VPPs. To define the original collection of OpcCollections, system 10 computes the bounding space around the problem. System 10 then segments space into fixed size volumes, where the number of volumes is a simple multiple of the number of desired VPPs (e.g., 4, 8, 12 or 16 OpcCollectionsNPP). For example, if the known complexity of the problem suggests that roughly 100 average computers are needed to solve the problem, system 10 would specify the number of OPC collections to be between 400 and 1600. A smaller multiplier amplifies the affect of repartitioning the problem when exchanging a tile to load balance. The multiplier is configurable because different applications (and different grids) may require coarser or finer optimization.

After system 10 has determined the number of pieces for a given problem, the next step is to create the boundaries for the individual problem pieces. To accomplish this, a general "spatial collection filter" determines the spatial boundaries for all of the OpcCollections. In this step, none of the actual OPC objects need be held in memory. These boundaries form a virtual spatial collection filter. As system 10 passes though the problem and look at each OPC, the filter is used to define to which collection an OPC belongs. Furthermore, system 10 can automatically detect the boundaries of the OPC collections (a complex problem in the prior art).

The generalized spatial filter automatically partitions an abstract problem into any regular or describable irregular configuration. Thus, the client 30 need not perform any manual steps to segment a problem; he just chooses the segmenting scheme (matrix, cube, honeycomb, trans-dimensional hypercube, etc) and submits the problem. System 10 segments the problem space into fixed size volumes (or areas, or whatever unit is appropriate for the dimension being used) that are appropriate for use by system 10. The filter might partition the problem space in addition to predefining the relationships between regions. The data structure of system 10 greatly simplifies this automatic discovery of relationships between problem pieces.

Figure 6:
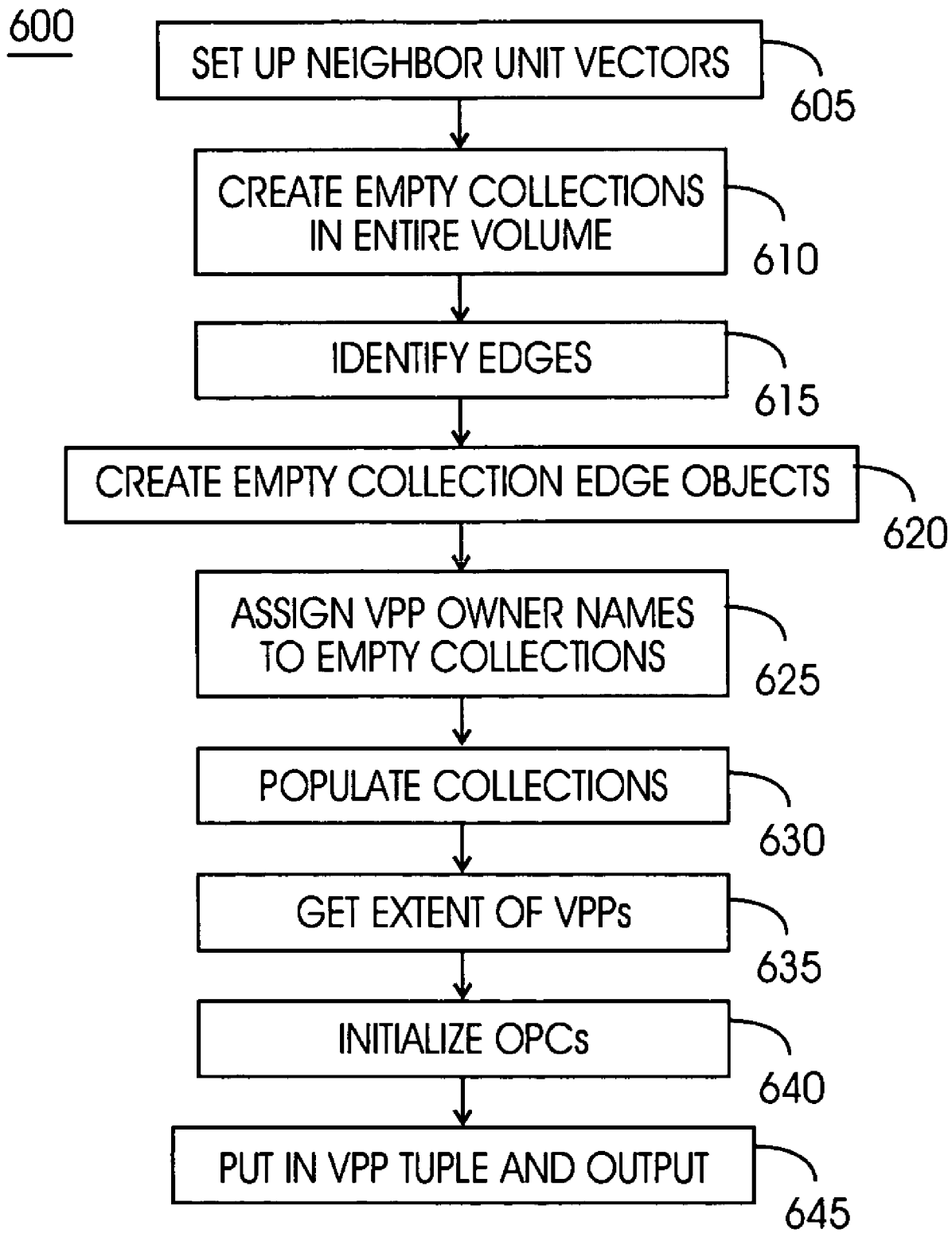
FIG. 6 is a process flow chart illustrating a method of operation of the automatic segmenting and populating system of FIG. 1.

The method 600 of creating an applying the spatial filter to a problem to segment the problem is illustrated by the process flow chart of FIG. 6, with further reference to the diagrams of FIG. 7. System has knowledge of the connections in the graph that defines the problem. At block 605, system 10 creates neighborhood unit vectors for the segmenting scheme chosen by the client 30, as shown by FIG. 7A, vectors 705 and 710. System 10 then creates empty collections in the entire problem volume at block 610, as shown by the volume 715 in FIG. 7B. The problem is not held in memory. Rather, system 10 partitions the space. Based on the partitions, system 10 discovers the common remote dependencies, or edges. Edges are identified at block 615 through spatial regions with coordinates, shown by edges 720, 725, and 730 in FIG. 7C.

Figure 7A:
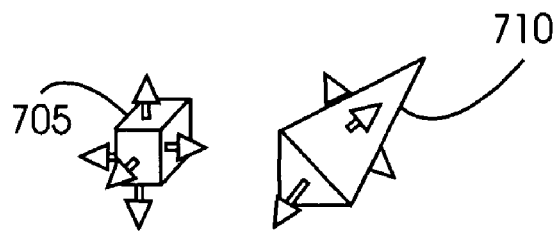
FIG. 7 is comprised of FIGS. 7A, 7B, 7C, 7D, 7E, 7F, 7G, 7H, and 7I and illustrate the steps in the method of operation of the automatic segmenting and populating system of FIG. 1.
Figure 7B:
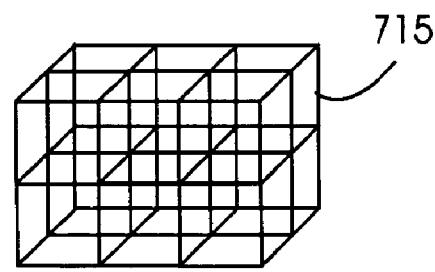
Figure 7C:
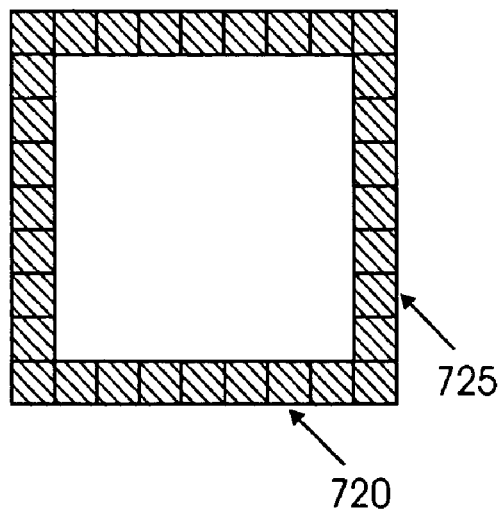
Figure 7C:
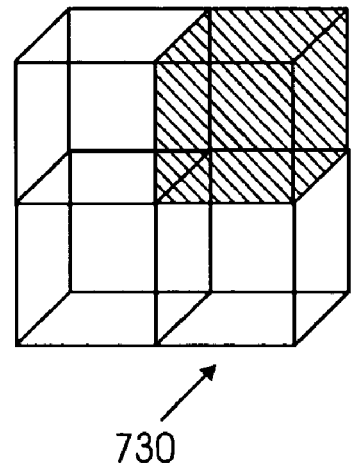
Figure 7D:
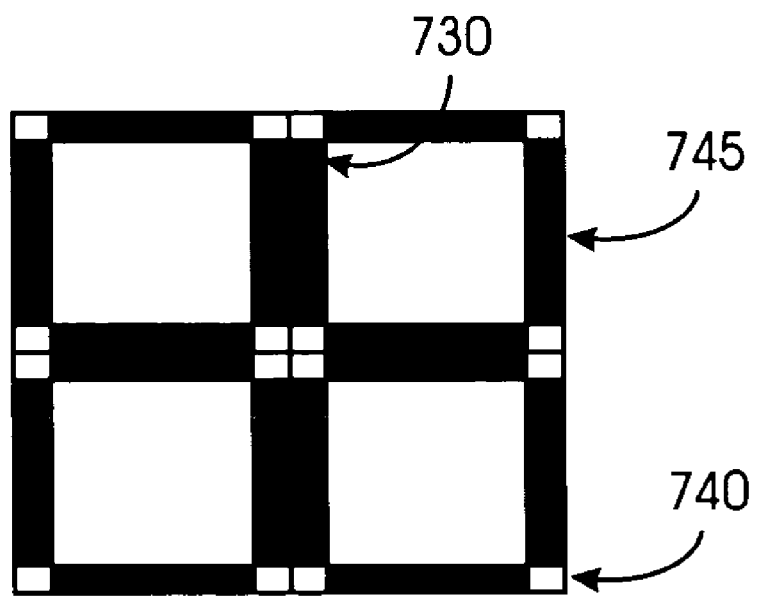
Figure 7E:
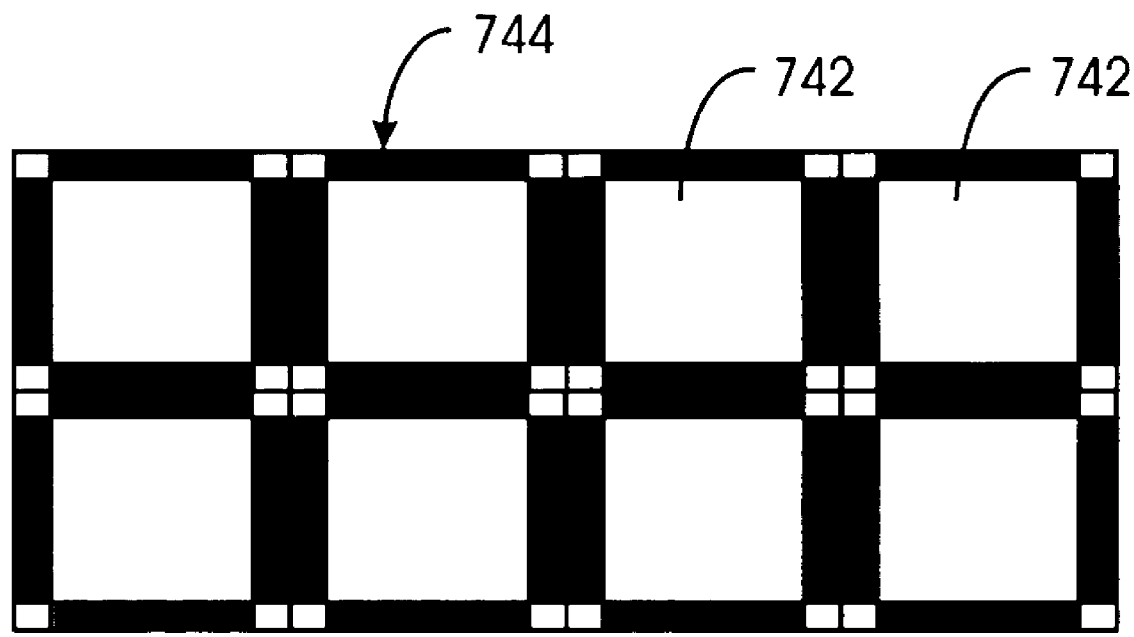

System 10 creates empty collection edge objects, grouping edges by common remote dependencies at block 620, as illustrated by edge collections 735, 740, 745 in FIG. 7D. At block 625, system 10 assigns VPP owner names to empty collections 742, shown in FIG. 7E. The problem is now described by a collection of objects. This partition space is an empty OPC collection object that defines a problem space filter 744.

Figure 7F:
Figure 7G:
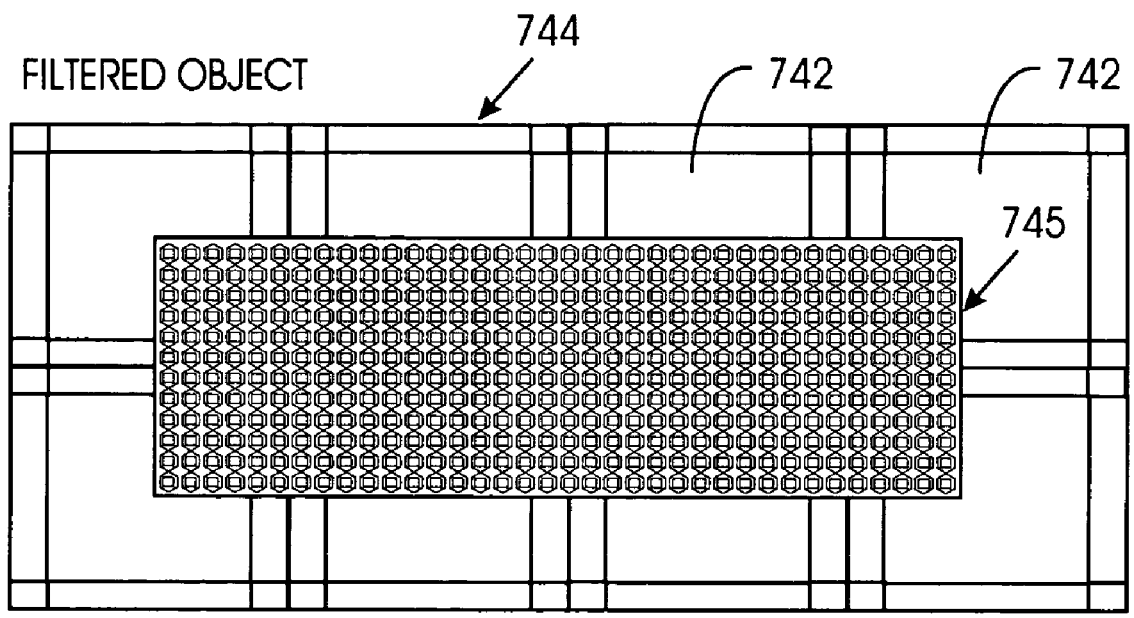

Having created the OPCs, formed them into OPC collections 742, and assigned them to VPPs, system 10 can now populate the OPC collections 742 at block 630 with the data 745 illustrated in FIG. 7F, and apply the spatial filter 744 (i.e., the data 745 is passed through the spatial filter 744), as illustrated in the visual representation of FIG. 7G. The filter partitions the problem space in addition to predefining the relationships between regions. System 10 populates the problem space filter 744, or template, with the data 745 from the problem, reading the problem serially and populating the collections with data. The data 744 is now selectively assigned to the OPC collections 742 based on their spatial coordinates.

Figure 7H:
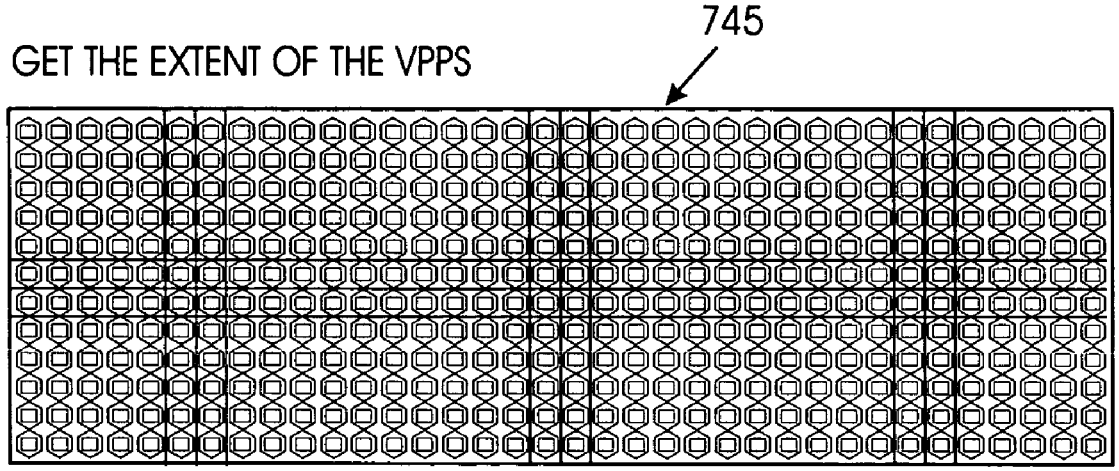

System 10 gets the extent of the VPPs at block 635, shown by FIG. 7H. The extent is the actual boundaries of the VPP based on the OPCs the VPP contains.

Figure 7I:
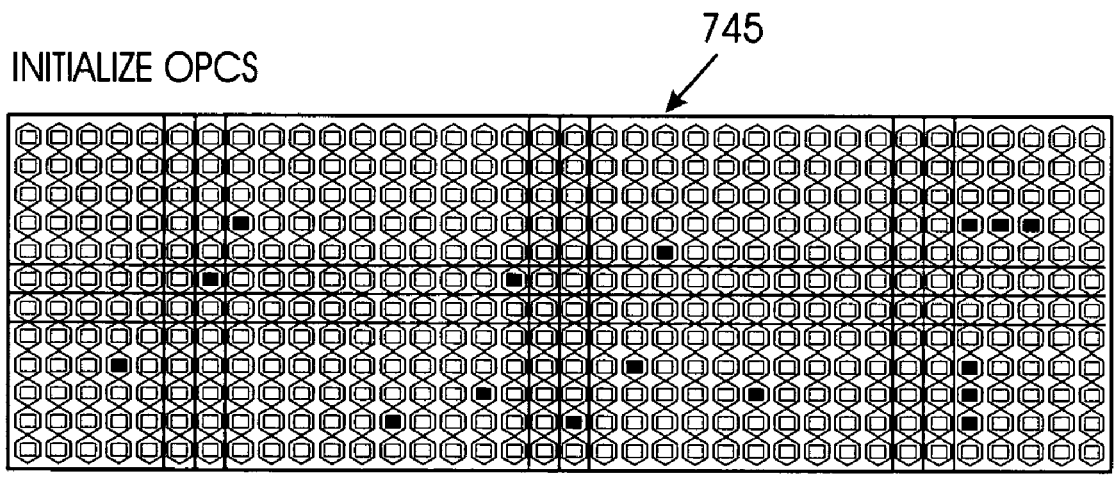
Figure 8A:
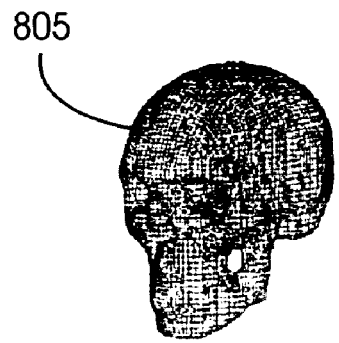
FIG. 8 is comprised of FIGS. 8A, 8B, 8C, and 8D, and illustrate the steps in the method of operation of the automatic segmenting and populating system of FIG. 1 using a skull example as the problem.
Figure 8B:
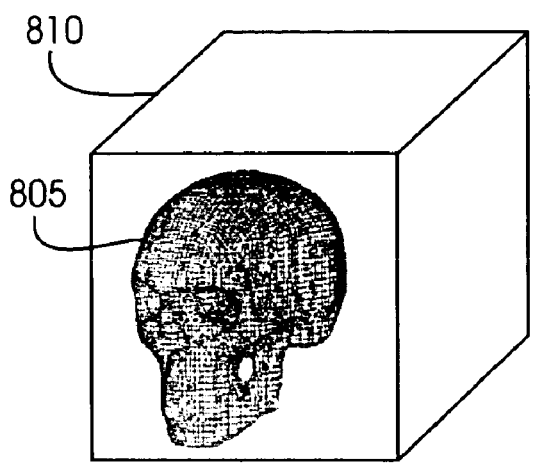
Figure 8C:
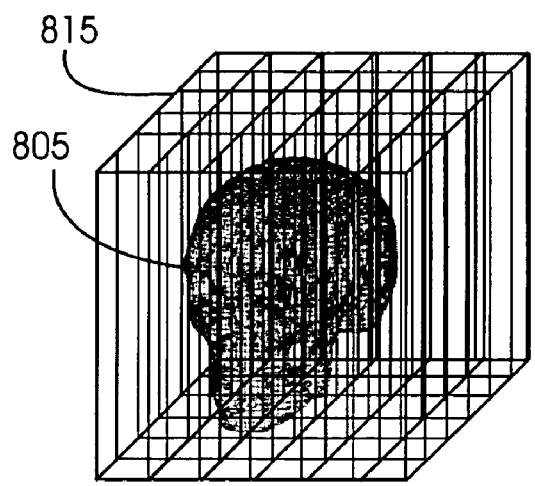
Figure 8D:
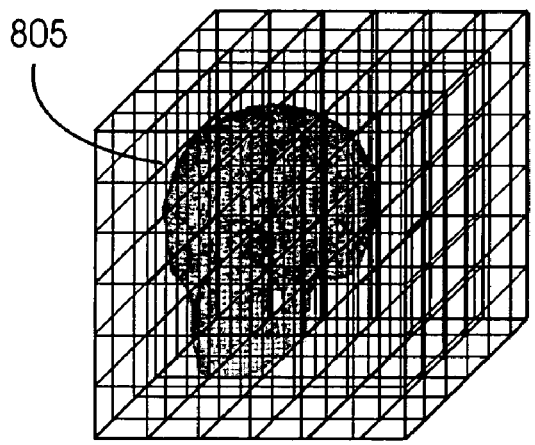

The OPCs are initialized at block 640 (FIG. 7I). The system then writes each VPP (i.e., problem piece) to a whiteboard by sending a message, for example, as a vector or tuple. Each problem piece, or VPP, is made up of one or more OpcCollections. System 10 then puts in the VPP tuple and output at block 645. The collections are written to the white boards 15 one at a time. System 10 knows the number of CAs 20 that are available, the number of OPCs and VPPs. From the number of OPCs and VPPs and the budget of client 30, system 10 determines the optimum number of CAs required to process the problem. Some of the CAs 20 are assigned a role of whiteboard 15; others are assigned processing roles. Based on the self-determined processing capability of each CA 20, system 10 individually sizes and assigns a VPP to each processing CA 20.

As an example, FIG. 8 (FIGS. 8A, 8B, 8C, 8D) illustrates the process of partitioning a problem space. FIG. 8A shows an initial FEM problem (modeling a skull 805 for stress). FIG. 8B shows the initial bounding box 810 (which is actually a little oversize in this example), and FIG. 8C shows the first pass of segmenting the space vertically into segments such as segment 815 (at a very coarse resolution, for example purposes). FIG. 8D shows the X, Y and Z divisions. The entire problem was decomposed into collections automatically, without any input needed from the client 30.

Each OPC stores its position relative to this filter. Therefore, each OPC can sort itself into an appropriate collection (i.e., tile or sub-volume). In addition, the accumulated complexity of each OPC collection (and thus, each variable problem partition) is tracked during the sorting process, so all of the necessary information (OPC count, OPC aggregate complexity, OPC total complexity) per OPC collection is computed during the OPC sorting phase.

When the problem has been partitioned into OPC collections, the next step is to turn those collections into actual problem partitions (VPPs) that may be sent to the available compute agents 20. The number of VPPs depends on the number of available computers, their performance measurements and the budget of client 30. The budget of client 30 is basically a set of constraints that potentially restrict the client 30 from employing very expensive machines or very large numbers of machines. An unlimited budget carries no restrictions. All OPCs in the VPP are handled by one CA 20. Only edges of the VPP are sent to another CA 20 if redistribution is needed to balance the load.

Each candidate compute agent 20 executes a set of tests, which results in a machine profile (written in XML). That profile is used to apportion the problem over the set of available agents. Though the actual profile contains many different measurements (Max CPU speed, actual "loaded" CPU speed, network bandwidth, network latency, available memory, available disk, floating point capability), CPU speed is used in the example.

Figure 9:
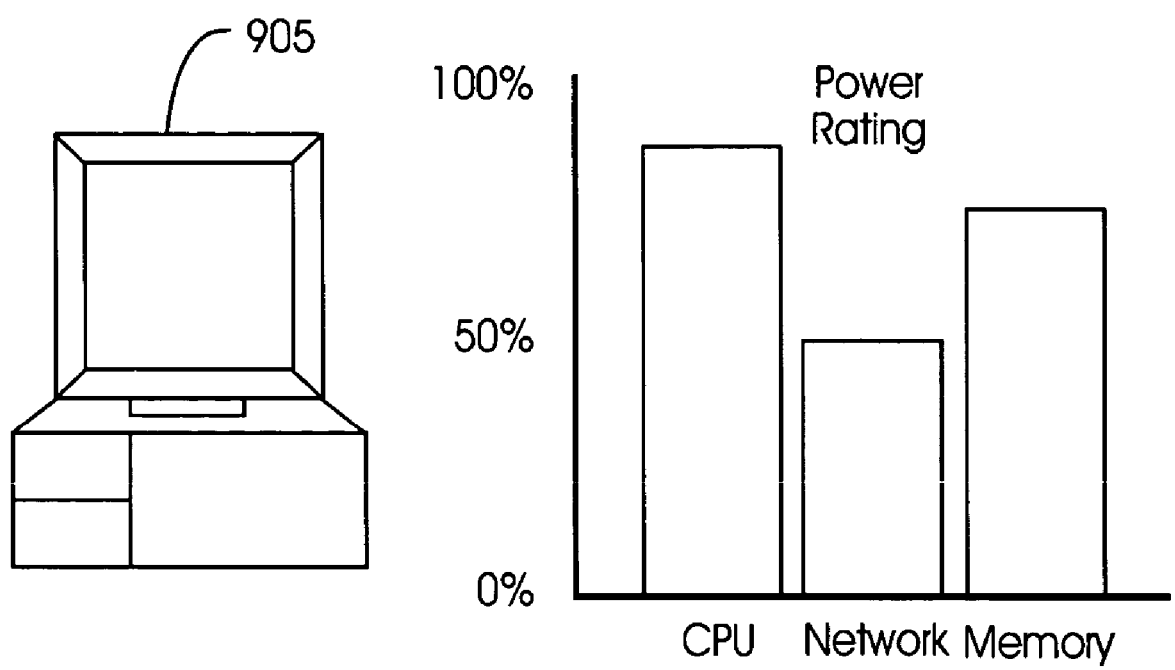
FIG. 9 is a diagram and graph illustrating the power rating of a compute resource used by the system of FIG. 1.

FIG. 9 shows a sample compute agent 20 such as CA 905. The power rating graph shows that CA 905 has a CPU power rating of 75%, a network power rating of 50%, and a memory capacity of 62%.

Figure 10A:
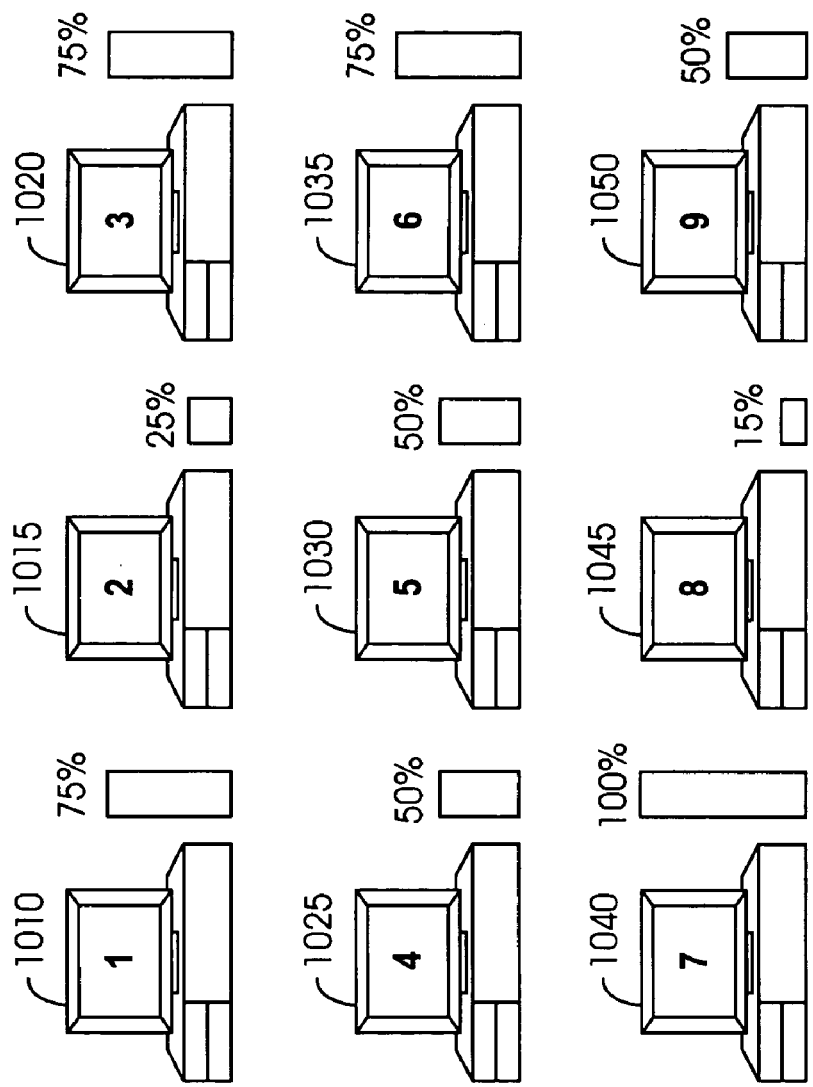
FIG. 10 is comprised of FIGS. 10A and 10B, and illustrates the distribution and load balancing methods of the system of FIG. 1.
Figure 10A:
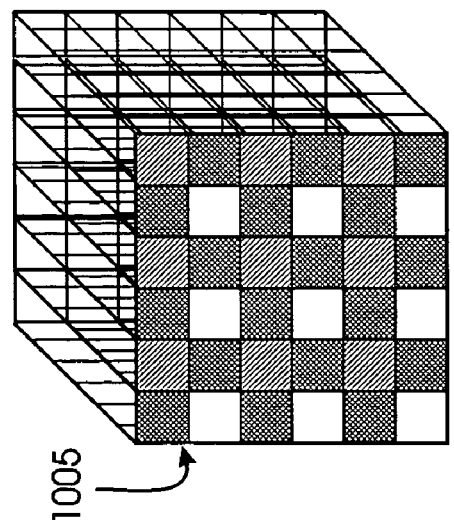
Figure 10B:
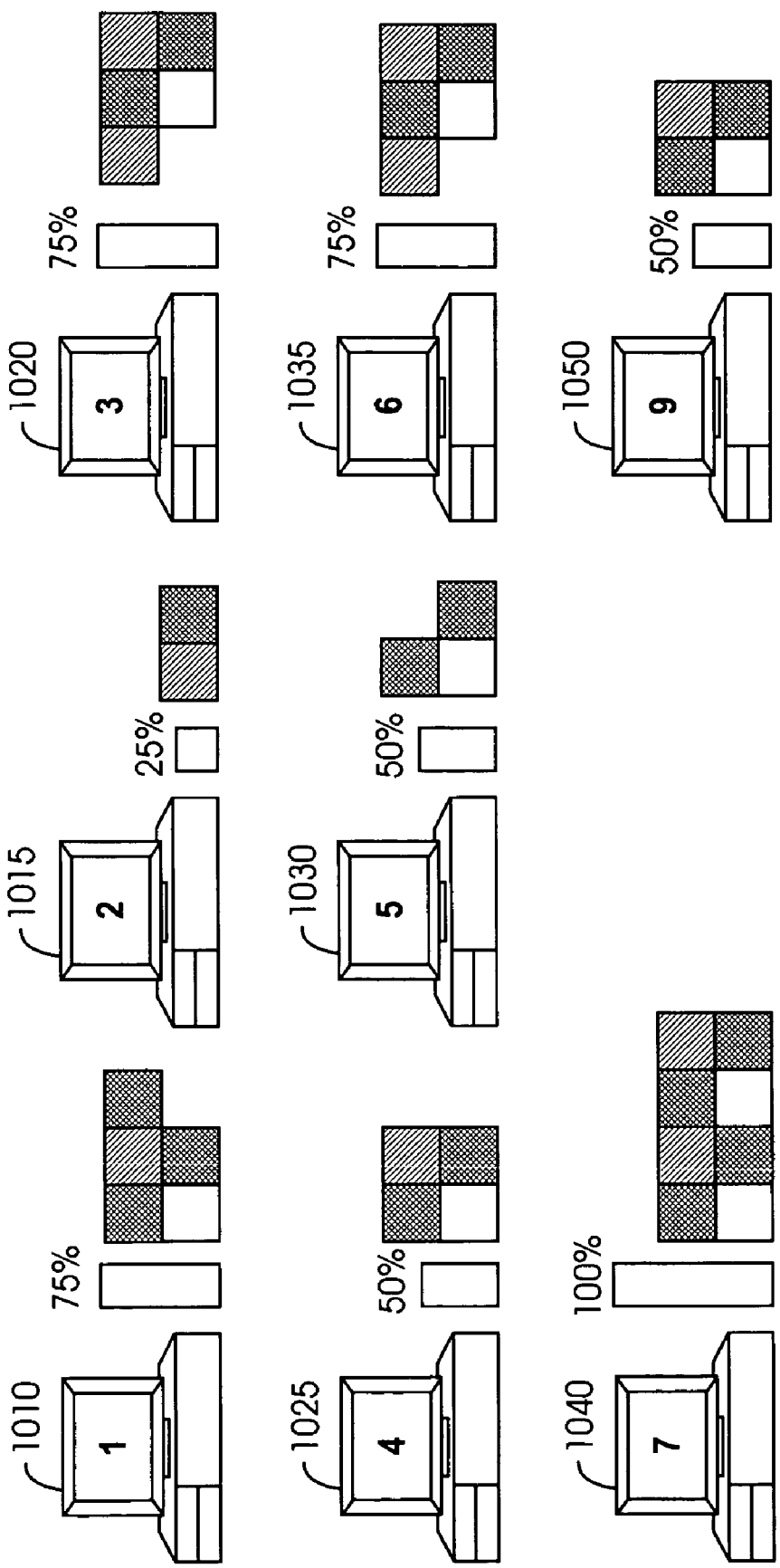

FIG. 10 (FIGS. 10A, 10B) illustrate the apportionment of the problem illustrated in FIG. 8, that of the skull 605. FIG. 10A shows one slice 1005, with that portion of the problem broken into OPC collections. This slice 1005 of 36 collections is spread over 9 potential compute agents 1010,1015, 1020, 1025, 1030,1035,1040,1045, 1050 with their compute ratings shown. In this example, the various agents all have reasonable compute ratings, except for compute agent 1045, which is currently too loaded to accept new work. However, compute agent 1040 has maximum capacity, so it can accept an "oversize" load, which makes up for the overly loaded compute agent 1045.

FIG. 10B shows the eventual apportionment of the problem. The 36 OPC collections are spread over 8 machines, compute agents 1010, 1015, 1020, 1025, 1030, 1035, 1040, 1050 (leaving out compute agent 1045), with the VPPs as shown here graphically. In the event that machine load changes during the problem computation, system 10 adjusts the problem distribution.

Philosophically, the assumption is made that system 10 does not have full administrative control over the available compute nodes. These nodes may be subject to unknowable and unpredictable loads. Since a single slow compute agent 20 may slow down the entire computation, autonomic load balancing is critical to distributed computation in such and environment. On the grid, recovery from a failed node is equivalent to the same problem as recovery from a node that has become so busy it is no longer useful. A slightly slower compute agent 20 might be given a smaller or "easier" piece to solve; a failed or heavily loaded machine should simply be replaced. System 10 is designed to deal with both situations.

System 10 actively takes advantage of the problem partitioning to balance the load during execution. VPPs may be redefined and redistributed during execution, if necessary, to optimize performance based on the actual computing agent parameters and costs observed or reported through self-tests. For example, a good rule for efficient execution of a computing problem may be that the time required to perform a computation sequence (iteration) of all OPCs in a VPP should be comparable to the time required to share results via edge OPCs at the VPP collection perimeters. The rules that yield cost-efficient execution may be saved and re-used to generate initial partitionings for subsequent computing problem execution runs.

Figure 11:
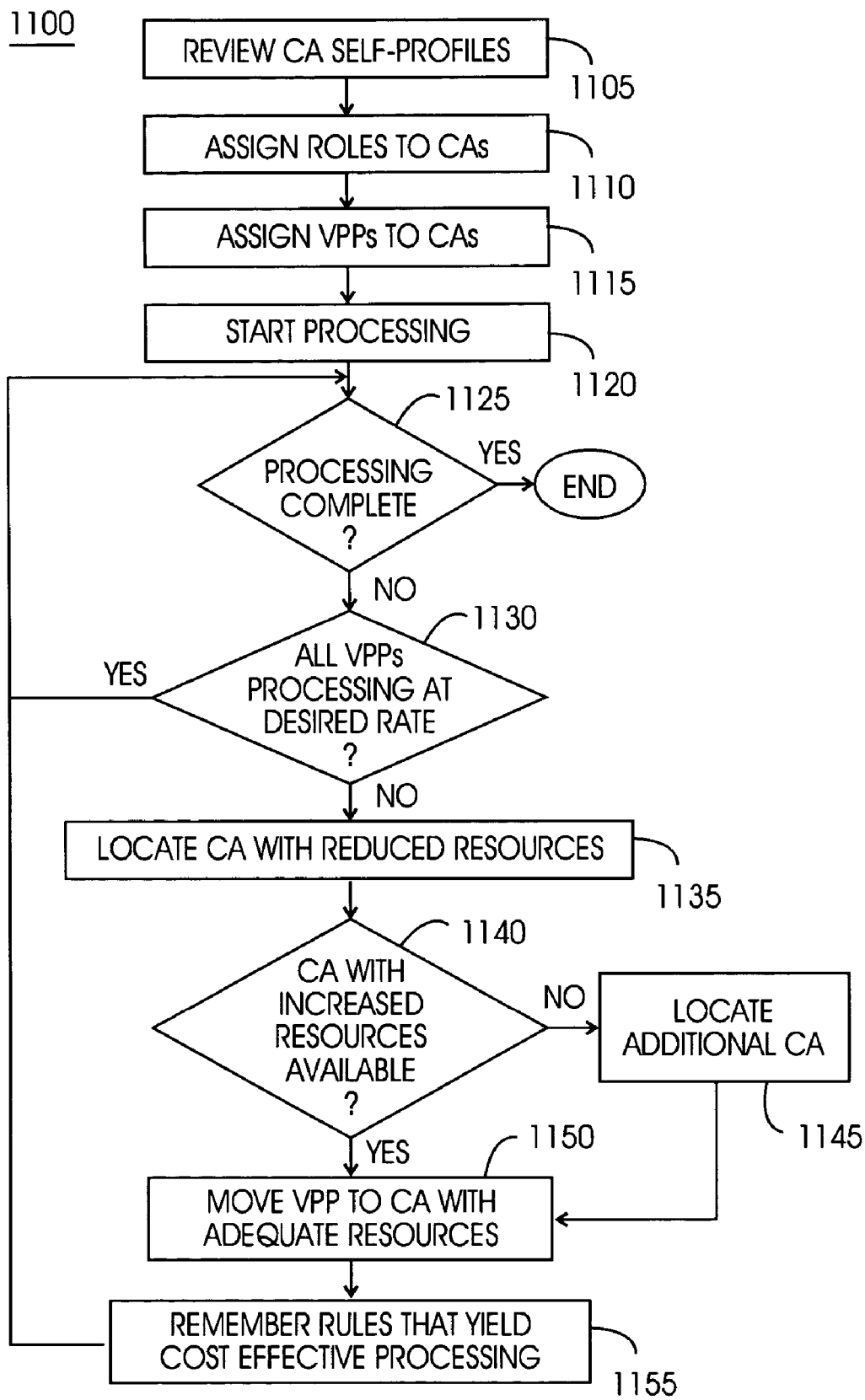
FIG. 11 is a process flow chart illustrating a method of operation of the load balancing system of FIG. 1.

The method 1100 of balancing the load is illustrated by the process flow chart of FIG. 11. System 10 creates an initial execution plan by reviewing the CA 20 self-profiles at block 1105. System 10 then assigns roles to the CAs 20 at block 1110; some CAs 20 may be whiteboards 25 while most may receive VPPs for processing at block 1115. At this point, system 10 has a "snapshot" of the processing capability of the grid created to process the problem. Processing begins at block 1120. If processing is complete at decision block 1125, the system terminates. Otherwise, system 10 is continually monitoring the performance of the CAs 20 in the grid. From the machine profile and power rating for each CA 20, system 10 compares the current capability of each CA 20 with their initial capability. At decision block 1130, system 10 uses this comparison to determine if all VPPs are processing at the desired rate. If the problem is progressing at the desired rate, system 10 returns to decision block 1125. Otherwise, system 10 locates any CAs 20 with reduced resources or power rating at block 1135. System 10 looks for CAs 20 with increased resources available at decision block 1140. If none are available, system 10 may locate an additional CA 20 among compute resources 40, 45 to add to the grid. System 10 may then move one or more VPPs from the CA 20 with reduced resources to the new CA 20 or CA 20 with increased resources. Processing then returns to decision block 1125;

blocks 1125 through 1150 are repeated continually, keeping the load balanced until processing is complete.

System 10 starts with an instance of the master console and the main communications controller. Each candidate machine runs an instance of the system 10 nugget that typically runs as a background daemon process but can be started by any other means. The OG Nugget can be a Tspaces® client and an OSGI framework, allowing it to listen to commands issued by the system 10 then load and run packages that are passed to the main controller from any authorized source. Each nugget registers with the system 10 so that the machine may be seen as available both by the client 30 (through the master console) and by the problem builder 25, which assigns the specific jobs for a problem computation. Once the nuggets are distributed and the generic agents are registered in system 10, the problem builder 25 automatically divides a problem provided by client 30 and defines the problem topology on the grid.

Figure 12:
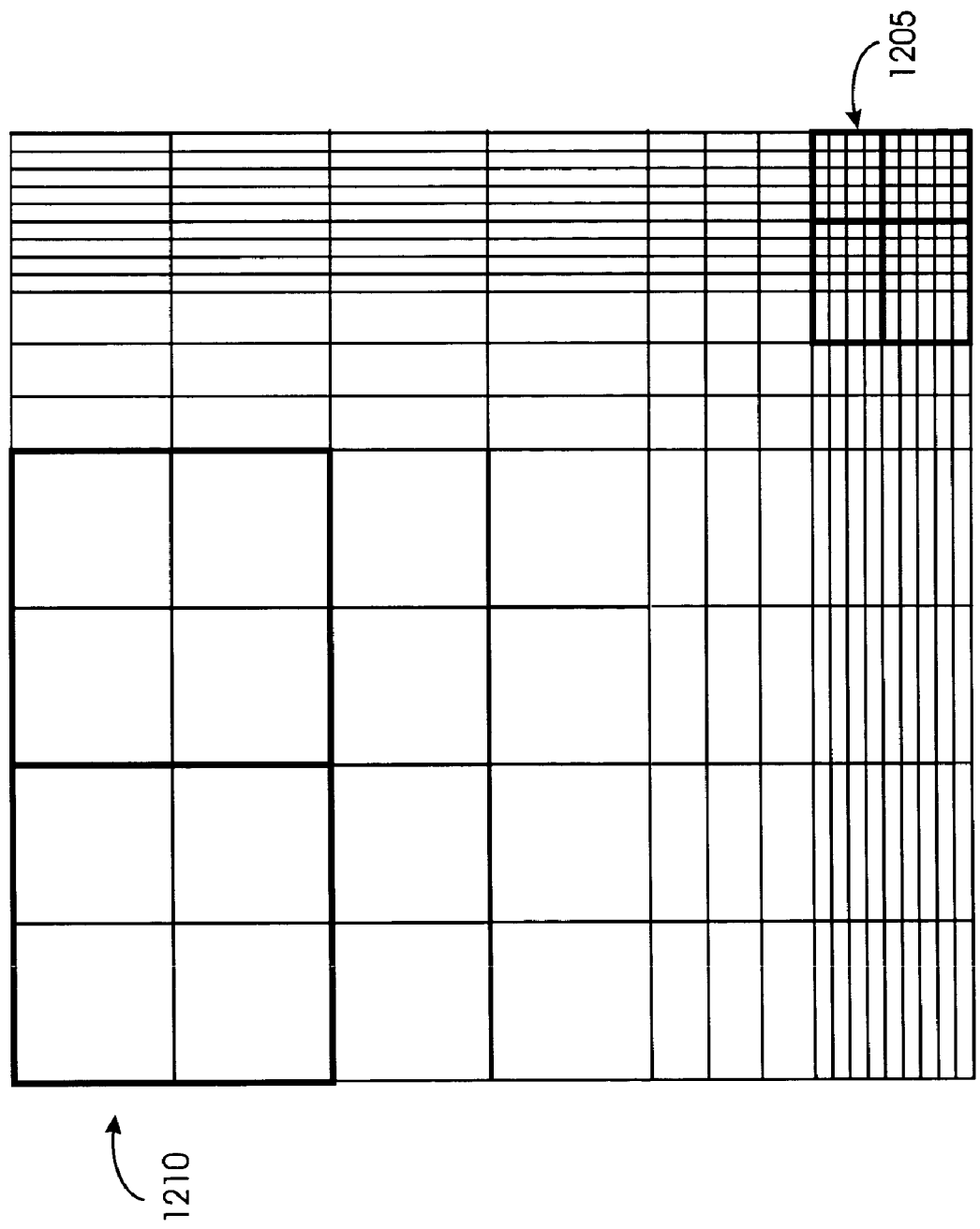
FIG. 12 is a graph illustrating uneven scaling of original problem cells to achieve desired granularity by the system of FIG. 1.

The OPC collections and VPPs created by system 10 have been demonstrated using equivalent sized OPC collections. Each OPC collection is a fixed size collection that stays the same through the duration of the problem. In an alternate embodiment, a problem may be structured so that all the interesting or critical activity occurs at one region of the problem space, as illustrated by FIG. 12. In FIG. 12, the density of OPCs is higher at OPC collection 1205 than at OPC collection 1210. The OPCs and OPC collections are smaller in size for OPC collection 1205 than for OPC collection 1210, but the amount of processing assigned to each OPC is still the same. System 10 can adjust the density of OPCs within the problem space to ensure the desired granularity or resolution of the result.

While system 10 is demonstrated using spatial or cellular FEM and other interconnected scientific problems, it should be obvious that this is a general-purpose architecture for launching any large distributed problem on a set of heterogeneous machines. The loosely coupled, asynchronous, distributed communications infrastructure provides complete flexibility in the way the various problem pieces communicate. Program synchronization can be done by direct message, broadcast, multi-cast, multi-receive, query or events (via client callbacks), etc.

It is to be understood that the specific embodiments of the invention that have been described are merely illustrative of certain application of the principle of the present invention. Numerous modifications may be made to the system and method for automatically segmenting and populating a distributed computing problem invention described herein without departing from the spirit and scope of the present invention.

What is claimed is:

1. A method of automatically segmenting and populating a distributed problem for processing, the method comprising:
    determining a bounding space that is at least equal in size to a problem space volume;
    partitioning the bounding space into a plurality of sub-spaces capable of holding collections of original problem cells;
    mapping the distributed problem into the partitioned bounding space to populate the sub-spaces with data from the problem;
    determining boundaries between the sub-spaces;
    determining coupling interdependencies between the sub-spaces;
    determining complexities associated with the boundaries;
    calculating densities of the data from the problem;
    if the densities of two or more contiguous collections fall below a lower level threshold, dynamically joining the two or more contiguous collections;
    if a particular collection density exceeds an upper threshold, dynamically subdividing the particular collection into a finer granularity; and
    processing the problem based on the boundaries, the coupling interdependencies, the complexities, and the densities.

* * * * *